(12) United States Patent
Yamazaki

(10) Patent No.: US 9,276,121 B2
(45) Date of Patent: Mar. 1, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/859,163

(22) Filed: Apr. 9, 2013

(65) Prior Publication Data

US 2013/0270563 A1    Oct. 17, 2013

(30) Foreign Application Priority Data

Apr. 12, 2012   (JP) ................................. 2012-091204

(51) Int. Cl.
    *H01L 29/04* (2006.01)
    *H01L 29/786* (2006.01)
    (Continued)

(52) U.S. Cl.
    CPC ...... *H01L 29/78609* (2013.01); *H01L 29/4908* (2013.01); *H01L 29/66742* (2013.01); *H01L 29/7869* (2013.01)

(58) Field of Classification Search
    CPC ............ H01L 29/4908; H01L 29/7869; H01L 29/78648
    USPC ....................... 257/43, 57; 438/158
    See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1 737 044 A1   12/2006
EP   2 226 847 A2    9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Cheung Lee
*Assistant Examiner* — Frederick B Hargrove
(74) *Attorney, Agent, or Firm* — Fish & Richardson P.C.

(57) ABSTRACT

A semiconductor device including a transistor in which an oxide semiconductor is used for a channel formation region and which has a positive threshold voltage to serve as a normally-off switching element, and the like are provided. Stable electrical characteristics are given to the semiconductor device including the transistor in which an oxide semiconductor film is used for the channel formation region, and thus the semiconductor device has high reliability. In a semiconductor device including a transistor in which an oxide semiconductor film including a channel formation region, source and drain electrode layers, a gate insulating film, and a gate electrode layer are stacked in this order over an oxide insulating film, a conductive layer overlapping with the gate electrode layer with the channel formation region provided therebetween and controlling the electrical characteristics of the transistor is provided in the oxide insulating film including an oxygen excess region.

14 Claims, 15 Drawing Sheets

(51) Int. Cl.
*H01L 29/66* (2006.01)
*H01L 29/49* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,067,775 B2 | 11/2011 | Miyairi et al. |
| 8,188,477 B2 | 5/2012 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2012/0001170 A1* | 1/2012 | Yamazaki ............... 257/43 |
| 2012/0040495 A1* | 2/2012 | Noda et al. ............. 438/104 |
| 2012/0104385 A1* | 5/2012 | Godo et al. ............. 257/43 |
| 2012/0161126 A1* | 6/2012 | Yamazaki ............... 257/43 |
| 2013/0075731 A1* | 3/2013 | Han et al. ............... 257/57 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

(56) References Cited

OTHER PUBLICATIONS

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancles in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000°C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350°C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QFVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

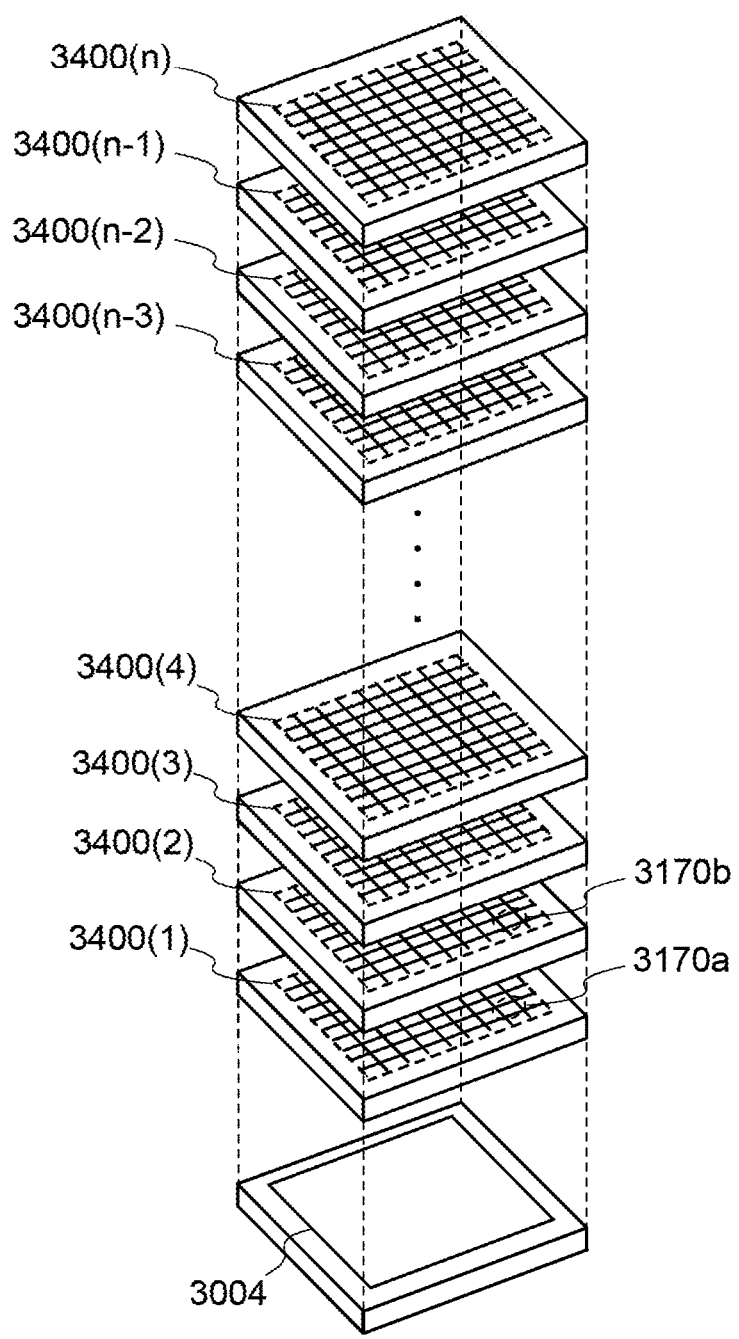

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic appliance are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (In—Ga—Zn—O-based amorphous oxide) is disclosed (see Patent Document 1).

REFERENCE

[Patent Document 1] Japanese Published Patent Application No. 2011-181801

SUMMARY OF THE INVENTION

Oxygen vacancies in an oxide semiconductor serve as donors to generate electrons that are carriers in the oxide semiconductor. Many oxygen vacancies in an oxide semiconductor including a channel formation region of a transistor lead to generation of electrons in the channel formation region, which causes a shift of the threshold voltage of the transistor in the negative direction.

An object of one embodiment of the present invention is to provide a semiconductor device including a transistor in which an oxide semiconductor is used for a channel formation region and which has a positive threshold voltage to serve as a normally-off switching element, and to provide a method for manufacturing the semiconductor device.

An object of one embodiment of the present invention is to enable a semiconductor device including a transistor in which an oxide semiconductor film is used for a channel formation region to have stable electrical characteristics and high reliability.

In a semiconductor device including a transistor in which an oxide semiconductor film including a channel formation region, source and drain electrode layers, a gate insulating film, and a gate electrode layer are stacked in this order over an oxide insulating film, a conductive layer overlapping with the gate electrode layer with the channel formation region provided therebetween and controlling the electrical characteristics of the transistor is provided in the oxide insulating film including an oxygen excess region.

The conductive layer can function as a second gate electrode layer controlling the electrical characteristics of the transistor. For example, by setting the potential of the conductive layer to GND, the threshold voltage of the transistor can be more positive and thus, the transistor can serve as a normally-off transistor.

In addition, the conductive layer has a function of blocking an external electric field, that is, a function of preventing the external electric field (particularly, a function of blocking static electricity) from affecting the inside. The blocking function of the conductive layer can prevent a change in the electrical characteristics of the transistor due to the effect of the external electric field such as static electricity.

Even when the oxide insulating film has a large thickness to provide the oxygen excess region effectively, part of the oxide insulating film, which is over the conductive layer, has a small thickness because the conductive layer is provided to project into the oxide insulating film; therefore, the distance between the conductive layer and the oxide semiconductor film can be short. Thus, the conductive layer can have a strong electrical effect on the transistor.

The oxide insulating film includes the oxygen excess region where the amount of contained oxygen exceeds the amount of oxygen of the stoichiometric composition of the oxide insulating film; accordingly, the oxide insulating film functions as an effective oxygen supply layer which prevents extraction of oxygen from the oxide semiconductor film and supplies oxygen to the oxide semiconductor film.

The conductive layer is provided to be embedded in the oxide insulating film, and the oxygen excess region where the amount of contained oxygen exceeds the amount of oxygen of the stoichiometric composition of the oxide insulating film is provided in the vicinity of the bottom surface of the oxide insulating film and in the vicinity of the conductive layer in the oxide insulating film.

The oxygen excess region can be formed by forming the conductive layer, forming the oxide insulating film over the conductive layer, and then performing oxygen introducing treatment (oxygen doping treatment) on the oxide insulating film including a projection caused by the shape of the conductive layer on its top surface. After the oxygen excess region is formed, the oxide insulating film is subjected to planarization treatment to remove the projection on its top surface. Through the planarization treatment, the oxide insulating film, which is over the conductive layer, is selectively removed to be thin, and the distance between part of the oxygen excess region, which is over the conductive layer, and the top surface of the oxide insulating film is shortened. On the other hand, part of the oxide insulating film, in which the conductive layer is not provided, is hardly removed, and thus the oxygen excess region is formed in the vicinity of the bottom surface of the part of the oxide insulating film. Consequently, in the oxide insulating film, the oxygen excess region is provided in the shallow position of a region where the conductive layer is provided and in the deep position of the other region (i.e., region where the conductive layer is not provided) from the top surface of the oxide insulating film.

Therefore, in part of the oxide insulating film, over which the oxide semiconductor film (at least the channel formation region) is provided and which overlaps with the conductive layer, the oxygen excess region can be provided close to the oxide semiconductor film; thus, oxygen can be efficiently supplied to the oxide semiconductor film from the oxygen excess region. Further, heat treatment can promote the supply of oxygen.

Moreover, in the oxide insulating film, in a region other than a region under the oxide semiconductor film which requires oxygen supply, the oxygen excess region is provided in the vicinity of the bottom surface of the oxide insulating film, which is apart from the top surface of the oxide insulating film. Thus, particularly in the case of performing the heat treatment, oxygen can be prevented from being unnecessarily released from the top surface of the oxide insulating film, and the oxide insulating film can be kept in an oxygen excess state.

Accordingly, in the semiconductor device, oxygen vacancies in the oxide semiconductor film, at the interface between the gate insulating film and the oxide semiconductor film, and the like can be compensated efficiently.

A barrier film (protective film) preventing release of oxygen is preferably provided under the conductive layer and the oxide insulating film or between the conductive layer and the oxide insulating film. Further, a barrier film (protective film) preventing release of oxygen is preferably provided over the transistor. Furthermore, barrier films may be provided over and under the transistor, and the barrier films may be in contact with each other at the periphery of the transistor to surround the transistor.

An aluminum oxide film, for example, has a superior shielding effect (blocking effect), which is not permeable to either oxygen or impurities such as hydrogen and moisture. For this reason, in and after the manufacturing process, an aluminum oxide film provided as the barrier film can prevent entry of impurities such as hydrogen and moisture, which cause a change in electrical characteristics of the transistor, into the oxide semiconductor film and the oxide insulating film and release of oxygen from the oxide semiconductor film and the oxide insulating film.

One embodiment of a structure of the present invention disclosed in this specification is a semiconductor device including a conductive layer; an oxide insulating film which is over the conductive layer to planarize a projection on the conductive layer and includes an oxygen excess region; an oxide semiconductor film which is over the oxide insulating film and includes a channel formation region; a source electrode layer and a drain electrode layer which are over the oxide semiconductor film and are electrically connected to the oxide semiconductor film; a gate insulating film which is over the oxide semiconductor film, the source electrode layer, and the drain electrode layer; a gate electrode layer which is over the gate insulating film and overlaps with the channel formation region; and an insulating film containing aluminum oxide which is over the oxide semiconductor film, the source electrode layer, the drain electrode layer, and the gate electrode layer. A region in the oxide insulating film which is over the conductive layer has a thickness smaller than that of the other region in the oxide insulating film. In the oxide insulating film, a distance between the oxygen excess region and the channel formation region is shorter than a distance between the oxygen excess region and each of the source electrode layer and the drain electrode layer.

Another embodiment of the present invention is a semiconductor device having the above-described structure in which an oxide insulating film is used as the gate insulating film. Moreover, when an oxygen-excess oxide insulating film is used as the gate insulating film, the oxide semiconductor film is sandwiched between the oxygen-excess oxide insulating films; thus, an effect of supplying oxygen to the oxide semiconductor film can be enhanced and oxygen vacancies can be compensated.

Another embodiment of the present invention is a semiconductor device having the above-described structure in which a metal oxide film(s) containing nitrogen are used in the uppermost surface of the conductive layer on the oxide semiconductor film side and/or the lowermost surface of the gate electrode layer on the oxide semiconductor film side. It is preferable to use a material with a large work function (e.g., more than or equal to 4.6 eV and less than or equal to 6.0 eV) for the conductive layer and/or the gate electrode layer (a film on the side closest to the oxide semiconductor film in the case of the conductive layer and/or the gate electrode layer which have/has a stacked-layer structure). In the case of using the film having a large work function as the conductive layer and the gate electrode layer, the threshold voltage of the transistor can be more positive, and thus, the transistor can serve as a normally-off transistor.

One embodiment of a structure of the present invention disclosed in this specification is a method for manufacturing a semiconductor device including the steps of: forming a conductive layer; forming an oxide insulating film over the conductive layer; performing oxygen doping treatment on the oxide insulating film to form an oxygen excess region in a vicinity of the conductive layer; performing polishing treatment on the oxide insulating film including the oxygen excess region to planarize a projection caused by the conductive layer; forming an oxide semiconductor film including a channel formation region over the planarized oxide insulating film; forming a source electrode layer and a drain electrode layer electrically connected to the oxide semiconductor film, over the oxide semiconductor film; forming a gate insulating film over the oxide semiconductor film, the source electrode layer, and the drain electrode layer; forming a gate electrode layer overlapping with the channel formation region, over the gate insulating film; and forming an insulating film containing aluminum oxide over the oxide semiconductor film, the source electrode layer, the drain electrode layer, and the gate electrode layer.

Another embodiment of the present invention is a method for manufacturing a semiconductor device using a chemical mechanical polishing method for the polishing treatment in the above-described structure.

Another embodiment of the present invention is a method for manufacturing a semiconductor device using an ion implantation method as the oxygen doping treatment in the above-described structure. The ion implantation method can be performed under the following conditions: the dose of oxygen is more than or equal to $0.5 \times 10^{16}$ cm$^{-2}$ and less than or equal to $5 \times 10^{16}$ cm$^{-2}$ (e.g., $1 \times 10^{16}$ cm$^{-2}$) and the acceleration energy is more than or equal to 50 eV and less than or equal to 70 eV (e.g., 50 eV).

Note that the "oxygen doping" means that oxygen (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for the oxygen doping treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen doping treatment.

Not only a film directly exposed to the oxygen doping treatment but also a film provided below the film can be doped with oxygen, depending on the condition of the oxygen doping treatment.

In the above structure, the oxide insulating film and the gate insulating film can be formed by a deposition method using a deposition gas. For example, a chemical vapor deposition (CVD) method can be used.

Further, heat treatment (dehydration or dehydrogenation treatment) by which hydrogen or moisture is eliminated may be performed on the oxide insulating film, the oxide semiconductor film, the gate insulating film, which are included in the semiconductor device.

Furthermore, a structure in which the gate electrode layer overlaps with part of the source electrode layer and part of the drain electrode layer or a structure in which the gate electrode layer does not overlap with part of the source electrode layer and part of the drain electrode layers may be employed. A structure in which the gate electrode layer overlaps with the source and drain electrode layers increases the on-state characteristics (e.g., on-state current and field-effect mobility) of the transistor.

In the case where the gate electrode layer does not overlap with the source and drain electrode layers, by introducing a dopant (impurity element) into the oxide semiconductor film in a self-aligned manner with the use of the gate electrode layer as a mask, a pair of low-resistance regions whose resistances are lower than that of the channel formation region and which include the dopant (impurity element) is formed in the oxide semiconductor film so that the channel formation region is provided between the low-resistance regions. The dopant is an impurity by which the electrical conductivity of the oxide semiconductor film is changed. As the method for introducing the dopant, an ion implantation method, an ion doping method, a plasma immersion ion implantation method, or the like can be used.

With the oxide semiconductor film including the low-resistance regions between which the channel formation region is provided in the channel length direction, the on-state characteristics (e.g., on-state current and field-effect mobility) of the transistor are increased, which enables high-speed operation and high-speed response of the transistor.

One embodiment of the present invention relates to a semiconductor device including a transistor or a semiconductor device including a circuit which is formed by using a transistor. For example, one embodiment of the present invention relates to a semiconductor device including a transistor in which an oxide semiconductor is used for a channel formation region or a semiconductor device including a circuit which is formed by using such a transistor. For example, one embodiment of the present invention relates to an electronic appliance which includes, as a component, a semiconductor integrated circuit including an LSI, a CPU, a power device mounted in a power supply circuit, a memory, a thyristor, a converter, an image sensor, or the like, or a light-emitting display device including a light-emitting element or an electro-optical device typified by a liquid crystal display panel.

One embodiment of the present invention provides a semiconductor device including a transistor in which an oxide semiconductor is used for a channel formation region and which has a positive threshold voltage to serve as a normally-off switching element, and provides a method for manufacturing the semiconductor device.

In a semiconductor device which includes a transistor including an oxide semiconductor film, stable electrical characteristics can be provided and high reliability can be achieved.

BRIEF DESCRIPTION OF THE DRAWINGS

FIG. 10 is a perspective view illustrating one embodiment of a semiconductor device.

DETAILED DESCRIPTION OF THE INVENTION

Embodiments of the invention disclosed in this specification are described below with reference to the accompanying drawings. Note that the invention disclosed in this specification is not limited to the following description, and it is easily understood by those skilled in the art that modes and details can be variously changed without departing from the spirit and the scope of the present invention. Further, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, one embodiment of a semiconductor device and a method for manufacturing the semiconductor device are described with reference to FIG. 1, FIGS. 2A to 2E, FIGS. 3A to 3C, FIGS. 4A to 4C, FIGS. 5A and 5B, and FIG. 8. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed.

Figure 1:
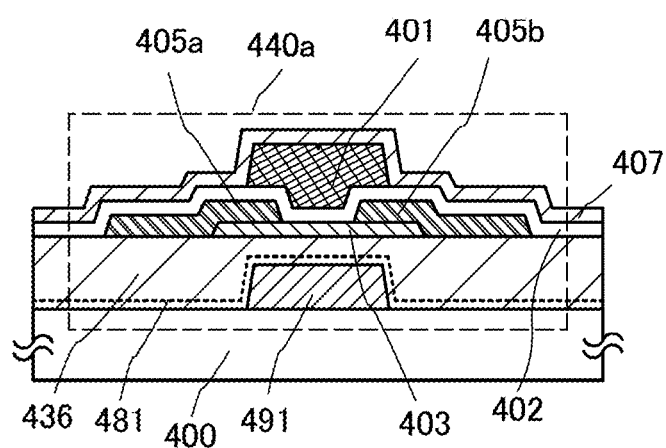
FIG. 1 is a cross-sectional view illustrating one embodiment of a semiconductor device.

A transistor 440a illustrated in FIG. 1 is an example of a top-gate transistor. FIG. 1 is a cross-sectional view taken along a channel length direction of the transistor 440a.

As illustrated in FIG. 1, a semiconductor device including the transistor 440a includes a conductive layer 491, an oxide insulating film 436 including an oxygen excess region 481, an oxide semiconductor film 403, a source electrode layer 405a, a drain electrode layer 405b, a gate insulating film 402, a gate electrode layer 401, and an insulating film 407, which are over a substrate 400 having an insulating surface.

The conductive layer 491 provided in the oxide insulating film 436 including the oxygen excess region 481 overlaps with the gate electrode layer 401 with a channel formation region provided therebetween, and controls the electrical characteristics of the transistor 440a.

The conductive layer 491 can function as a second gate electrode layer (also referred to as back gate) controlling the electrical characteristics of the transistor 440a. For example, by setting the potential of the conductive layer 491 to GND, the threshold voltage of the transistor 440a can be more positive and thus, the transistor 440a can be a normally-off transistor.

In addition, the conductive layer 491 has a function of blocking an external electric field, that is, a function of preventing the external electric field (particularly, a function of blocking static electricity) from affecting inside the transistor 440a. The blocking function of the conductive layer 491 can prevent a change in the electrical characteristics of the transistor 440a due to the effect of the external electric field such as static electricity.

Even when the oxide insulating film 436 has a large thickness to provide the oxygen excess region 481 effectively, part of the oxide insulating film 436, which is over the conductive layer 491 has a small thickness because the conductive layer 491 is provided to project into the oxide insulating film 436; therefore, the distance between the conductive layer 491 and the oxide semiconductor film 403 can be short. Thus, the conductive layer 491 can have a strong electrical effect on the transistor 440a.

The oxide insulating film 436 includes the oxygen excess region 481 where the amount of contained oxygen exceeds the amount of oxygen of the stoichiometric composition of the oxide insulating film 436; accordingly, the oxide insulating film 436 functions as an effective oxygen supply layer which prevents extraction of oxygen from the oxide semiconductor film 403 and supplies oxygen to the oxide semiconductor film 403.

The oxygen excess region can be formed by forming the conductive layer 491, forming the oxide insulating film 436 over the conductive layer 491, and then performing oxygen doping treatment on the oxide insulating film 436 including a projection caused by the shape of the conductive layer 491 on its top surface. After the oxygen excess region 481 is formed, the oxide insulating film 436 is subjected to planarization treatment to remove the projection on its top surface. Through the planarization treatment, the oxide insulating film 436, which is over the conductive layer 491, is selectively removed to be thin, and the distance between part of the oxygen excess region 481, which is over the conductive layer 491, and the top surface of the oxide insulating film 436 is shortened. On the other hand, part of the oxide insulating film 436, in which the conductive layer 491 is not provided, is hardly removed, and thus the oxygen excess region 481 is formed in the vicinity of the bottom surface of the part of the oxide insulating film 436. Consequently, in the oxide insulating film 436, the oxygen excess region 481 is provided in the shallow position of a region where the conductive layer 491 is provided and in the deep position of the other region (i.e., region where the conductive layer is not provided) from the top surface of the oxide insulating film 436.

Therefore, in part of the oxide insulating film 436, over which the oxide semiconductor film 403 (at least the channel formation region) is provided and which overlaps with the conductive layer 491, the oxygen excess region 481 can be provided close to the oxide semiconductor film 403; thus, oxygen can be efficiently supplied to the oxide semiconductor film 403 from the oxygen excess region 481. Further, heat treatment can promote the supply of oxygen.

Moreover, in the oxide insulating film 436, in a region other than a region under the oxide semiconductor film 403 which requires oxygen supply, the oxygen excess region 481 is provided in the vicinity of the bottom surface of the oxide insulating film 436, which is apart from the top surface of the oxide insulating film 436. Thus, particularly in the case of performing the heat treatment, oxygen can be prevented from being unnecessarily released from the top surface of the oxide insulating film 436, and the oxide insulating film 436 can be kept in an oxygen excess state.

Accordingly, in the transistor 440a, oxygen vacancies in the oxide semiconductor film 403, at the interface between the gate insulating film 402 and the oxide semiconductor film 403, and the like can be compensated efficiently.

As in the transistor 440a, a barrier film (protective film) which effectively prevents release of oxygen is preferably provided as the insulating film 407.

Figure 3A:
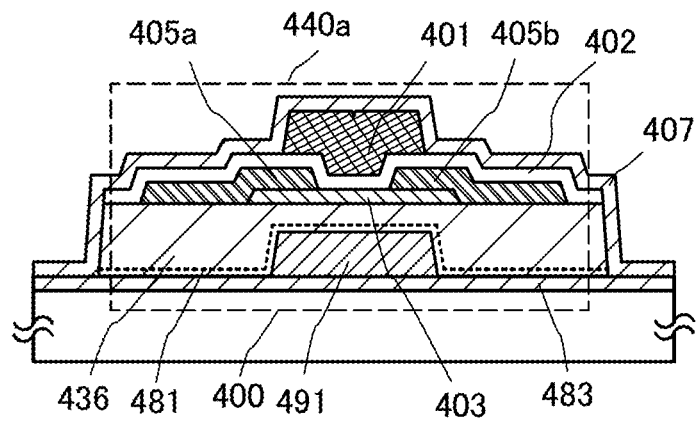
FIGS. 3A to 3C are cross-sectional views illustrating one embodiment of a semiconductor device.

Alternatively, as illustrated in FIG. 3A, as a barrier film (protective film) preventing release of oxygen, an insulating film 483 may be provided under the conductive layer 491 and the oxide insulating film 436.

Figure 3B:
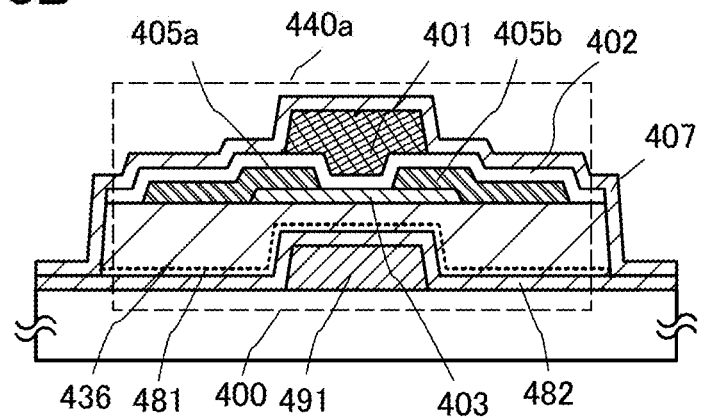

Further alternatively, as illustrated in FIG. 3B, as a barrier film (protective film) preventing release of oxygen, an insulating film 482 may be provided between the conductive layer 491 and the oxide insulating film 436.

Figure 3C:
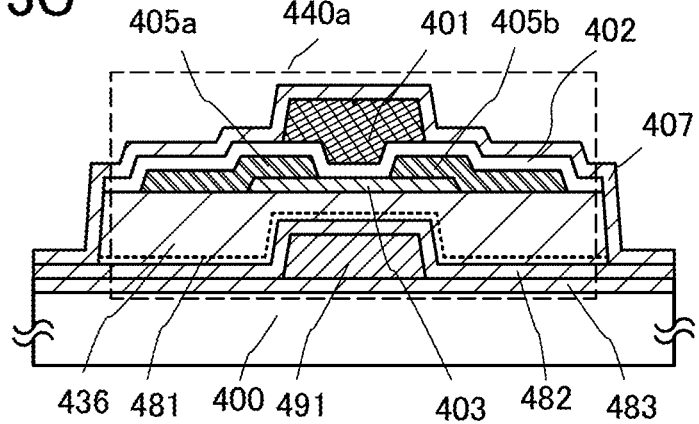

Still further alternatively, as illustrated in FIG. 3C, the insulating film 483 may be provided under the conductive layer 491 and the oxide insulating film 436, and the insulating film 482 may be provided between the conductive layer 491 and the oxide insulating film 436.

The insulating film (e.g., the insulating film 407, 482, or 483) functioning as a barrier film is preferably a dense film which can prevent release of oxygen from the oxide insulating film 436 including the oxygen excess region 481, the oxide semiconductor film 403, and the gate insulating film 402 and entry of impurities such as hydrogen and moisture.

As the insulating films 407, 482, and 483 functioning as barrier films, for example, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium zinc oxide film, or a zinc oxide film can be used. The inorganic insulating film may have a single-layer structure or a stacked-layer structure. A plasma CVD method, a sputtering method, or a CVD method using a deposition gas can be used to form the insulating films 407, 482, and 483 functioning as the barrier films.

As the insulating films 407, 482, and 483 functioning as the barrier films, a film containing aluminum oxide can be preferably used. Further, a stacked film in which a titanium oxide film, a nickel oxide film, a molybdenum oxide film, or a tungsten oxide film is stacked under or on an aluminum oxide film may be provided as the barrier film.

The aluminum oxide film has a superior shielding effect (blocking effect), which is not permeable to either oxygen or impurities such as hydrogen and moisture. For this reason, an aluminum oxide film provided as the insulating film (e.g., the insulating film 407, 482, or 483) functioning as a barrier film can favorably functions as a barrier film in and after the manufacturing process. The aluminum oxide film prevents entry of impurities such as hydrogen and moisture, which cause a change in electrical characteristics of the transistor, into the oxide insulating film 436, the oxide semiconductor film 403, and the gate insulating film 402 and release of oxygen from the oxide insulating film 436, the oxide semiconductor film 403, and the gate insulating film 402.

In addition, as illustrated in FIGS. 3A to 3C, in the case of providing the insulating films (the insulating films 407, 482, and 483) functioning as the barrier films over and under the transistor 440a, the insulating films (the insulating film 407 and the insulating film 482 and/or the insulating film 483) may be in contact with each other around the oxide insulating film 436 and the transistor 440a so that the insulating films surround the oxide insulating film 436 including the oxygen excess region 481 and the transistor 440a. In such a case, it is preferable that the conductive layer 491, the source electrode layer 405a, the drain electrode layer 405b, and the gate electrode layer 401 be electrically connected to the outside at a place located as far apart as possible from the oxide semiconductor film 403. Around the oxide semiconductor film 403, upper and lower edge portions of the oxide insulating film 436 including the oxygen excess region 481 and the gate insulating film 402 are covered with the insulating films (the insulating film 407 and the insulating film 482 and/or the insulating film 483); thus, the effect of preventing release of oxygen and entry of impurities such as hydrogen and moisture is more enhanced. Consequently, favorable electrical characteristics of the transistor 440a can be kept for a long time, which makes it possible to provide a highly reliable semiconductor device.

Note that in the case of using the aluminum oxide film as the insulating films 407, 482, and 483 functioning as the barrier films, the aluminum oxide film preferably has high density (the film density is higher than or equal to 3.2 $g/cm^3$, preferably higher than or equal to 3.6 $g/cm^3$), in which case the transistor 440a can have more stable electrical characteristics. The film density can be measured by Rutherford backscattering spectrometry (RBS) or X-ray reflection (XRR).

It is preferable to use a material with a large work function (e.g., more than or equal to 4.6 eV and less than or equal to 6.0 eV) for the conductive layer 491 and/or the gate electrode layer 401 (a film on the side closest to the oxide semiconductor film 403 in the case of the conductive layer 491 and/or the gate electrode layer 401 which have/has a stacked-layer structure). For example, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a metal nitride (InN, SnN, or the like) film can be used. These films each have a work function of 5 eV (electronvolts) or higher, preferably 5.5 eV (electronvolts) or higher, which enables the threshold voltage of the transistor to be positive when used as the conductive layer 491 and/or the gate electrode layer 401, so that a normally-off switching element can be provided.

Figure 5A:
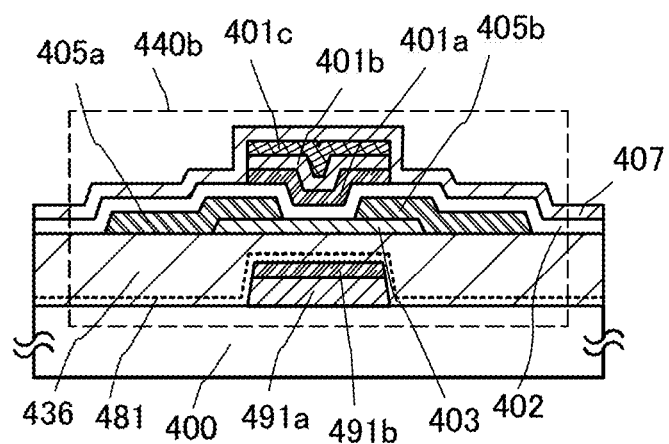
FIGS. 5A and 5B are cross-sectional views each illustrating one embodiment of a semiconductor device.

FIG. 5A illustrates an example of a transistor 440b including a conductive layer and a gate electrode layer each having a stacked-layer structure. In the transistor 440b illustrated in FIG. 5A, a conductive layer 491a and a conductive layer 491b are stacked in this order from the substrate 400 side, and a gate electrode layer 401a, a gate electrode layer 401b, and a gate electrode layer 401c are stacked in this order from the gate insulating film 402 side. In the transistor 440b, for example, a copper film and an In—Ga—Zn—O film containing nitrogen can be used as the conductive layer 491a and the conductive layer 491b, respectively. Further, an In—Ga—Zn—O film containing nitrogen, a tantalum nitride film, and a tungsten film can be used as the gate electrode layer 401a, the gate electrode layer 401b, and the gate electrode layer 401c, respectively.

An In—Ga—Zn—O film containing nitrogen with a large work function is used as the conductive layer 491b and the gate electrode layer 401a which are close to the oxide semiconductor film 403 to enable the threshold voltage of the transistor 440b to be positive, and thus, a normally-off switching transistor can be provided. The conductive layer 491b and the gate electrode layer 401a each have a work function larger than that of the tungsten film used as the gate electrode layer 401c, preferably larger than that of the tungsten film by 1 eV or more.

Further, when movable ions of sodium or the like are contained in the gate insulating film and positive bias is applied to the gate electrode layer, the positive movable ions move to the interface between the gate insulating film and the oxide semiconductor film, which causes electrical characteristics of the transistor to shift in the direction of normally-on.

In a transistor with a structure in which a conductive layer, an oxide insulating film, an oxide semiconductor film, a gate insulating film, and a gate electrode layer are stacked in this order, even when movable ions of sodium or the like are contained in the oxide insulating film, the movable ions can move from the interface between the oxide semiconductor film and the oxide insulating film to the conductive layer side by applying a negative bias to the conductive layer.

Further, with the use of a material having a large work function for the gate electrode layer (the conductive layer), positive movable ions at the interface between the gate insulating film (the oxide insulating film) and the oxide semiconductor film can be pulled (moved) to the gate electrode layer (the conductive layer) side.

Figure 8:
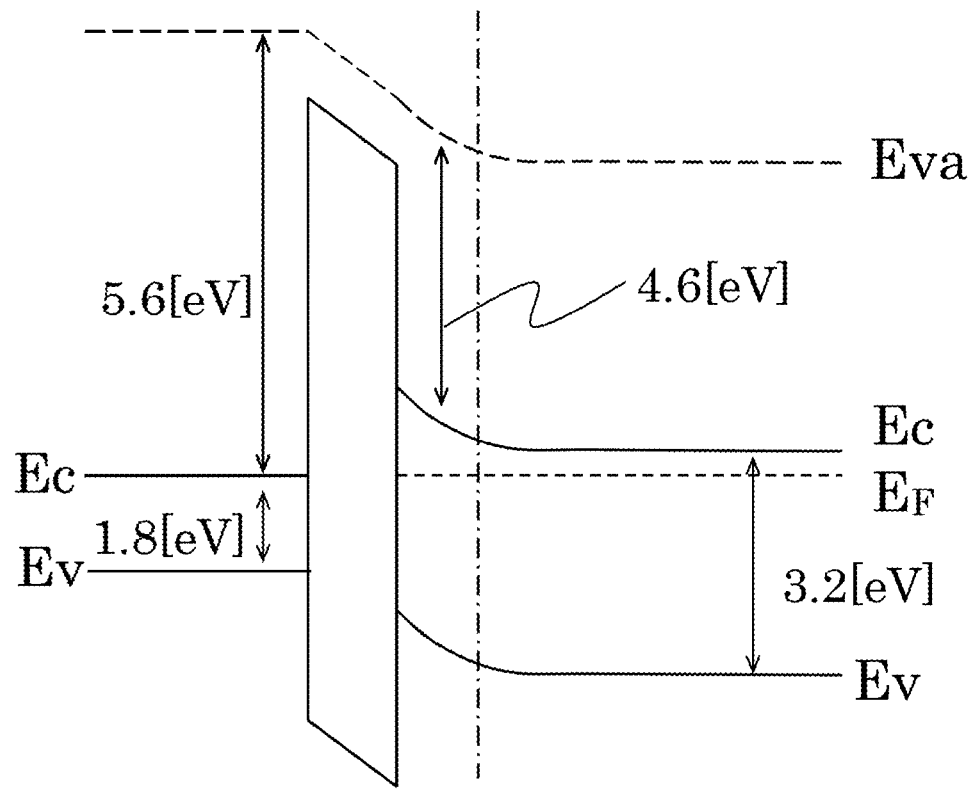
FIG. 8 is a diagram illustrating a band structure of one embodiment of a semiconductor device.

FIG. 8 illustrates a schematic diagram example of a band structure of a MOSFET model in which In—Ga—Zn—O (IGZO) is used as an oxide semiconductor, In—Ga—Zn—O containing nitrogen (IGZON) is used as a gate electrode layer, and the IGZON, a gate insulating film (GI), and the IGZO are stacked in this order. Here, the IGZO has an electron affinity of 4.6 eV and a band gap of 3.2 eV, and the IGZON has a work function of 5.6 eV and a band gap of 1.8 eV. Note that in FIG. 8, the IGZO is an n-type, and the Fermi level $E_F$ thereof is located above the center of the band gap.

As illustrated in FIG. 8, the band of the IGZO curves upward in the vicinity of the interface between the IGZO and the GI, and the flat band voltage $V_{FB}$ is higher than 0. Thus, an electric field is generated in the GI from the interface between the IGZO and the GI toward the interface between the GI and the IGZON; accordingly, the interface between the IGZO and the GI is positively charged and the interface between the GI and the IGZON is negatively charged. That is, the positive movable ions at the interface between the IGZO and the GI move to the negatively charged IGZON side.

In the above-described manner, the usage of the material with a large work function (e.g., the IGZON) for the gate electrode layer also has an effect of pulling (moving) positive movable ions at the interface between the oxide semiconductor film and the gate insulating film to the gate electrode layer side.

Thus, the interface between the oxide semiconductor film and the gate insulating film can be stable and the characteristics of the transistor can be normally-off.

Note that the above-described effect occurs both between a conductive layer and an oxide semiconductor film with an oxide insulating film provided therebetween and between an oxide semiconductor film and a gate electrode layer with a gate insulating film provided therebetween.

An oxide semiconductor used for the oxide semiconductor film 403 preferably contains at least indium (In). In particular, In and zinc (Zn) are preferably contained. The oxide semiconductor preferably contains, in addition to In and Zn, gallium (Ga) serving as a stabilizer that reduces variations in electrical characteristics among transistors including the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$ (n>0 is satisfied, n is an integer) may be used.

For example, an In—Ga—Zn-based oxide with a composition at an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or an oxide with a composition close to the above composition can be used. Alternatively, an In—Sn—Zn-based oxide with a composition at an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with a composition close to the above composition may be used.

However, without limitation to the materials given above, a material with an appropriate composition may be used as the oxide semiconductor containing indium depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, with an In—Sn—Zn-based oxide, high mobility can be obtained relatively easily. However, mobility can be increased by reducing the defect density in a bulk also in the case of using an In—Ga—Zn-based oxide.

For example, in the case where the composition of an oxide containing In, Ga, and Zn at the atomic ratio of In:Ga:Zn=a:b:c (a+b+c=1) is close to the composition of an oxide containing In, Ga, and Zn at the atomic ratio of In:Ga:Zn=A:B:C (A+B+C=1), a, b, and c satisfy the following relation: $(a-A)^2+(b-B)^2+(c-C)^2 \le r^2$. For example, r may be 0.05. The same applies to other oxides.

Here, a structure of an oxide semiconductor film is described.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Note that part of oxygen included in the oxide semiconductor film may be substituted with nitrogen.

Further, in an oxide semiconductor having a crystal part such as the CAAC-OS, defects in the bulk can be further reduced, and mobility higher than that of an oxide semiconductor in an amorphous state can be obtained by improving the surface flatness. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of arithmetic average roughness that is defined by JIS B 0601: 2001 (ISO4287:1997) so as to be applied to a curved plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0|\, dx\, dy \qquad \text{[Formula 1]}$$

Here, the specific surface is a surface that is a target of roughness measurement, and is a quadrilateral region specified by four points at the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. In addition, $S_0$ represents the area of a rectangle which is obtained by projecting the specific surface on the xy plane, and $Z_0$ represents the height of the reference surface (the average height of the specific surface). Ra can be measured with an atomic force microscope (AFM).

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Further, the concentration of impurities in a deposition gas may be reduced. Specifically, a deposition gas with a dew point of −80° C. or lower, preferably −100° C. or lower, more preferably −120° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Further, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The oxide semiconductor film 403 may have a structure in which a plurality of oxide semiconductor films is stacked. For example, the oxide semiconductor film 403 may have a stacked-layer structure of a first oxide semiconductor film and a second oxide semiconductor film which are formed using metal oxides with different compositions. For example, the first oxide semiconductor film may be formed using a three-component metal oxide, and the second oxide semiconductor film may be formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film are made to be the same and the composition of the constituent elements of the first oxide semiconductor film and the second oxide semiconductor film may be made to be different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

Further, oxide semiconductors having different crystallinities may be used for the first oxide semiconductor film and the second oxide semiconductor film. That is, the oxide semiconductor film 403 may be formed using any of a single crystal oxide semiconductor, a polycrystalline oxide semiconductor, an amorphous oxide semiconductor, and a CAAC-OS, as appropriate. When an amorphous oxide semiconductor is used for at least one of the first oxide semiconductor film and the second oxide semiconductor film, internal stress or external stress of the oxide semiconductor film 403 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. For this reason, the oxide semiconductor film on the channel side is preferably formed using a crystalline oxide semiconductor such as a CAAC-OS.

Further, the oxide semiconductor film 403 may have a stacked-layer structure including three or more layers in which an amorphous oxide semiconductor film is interposed between a plurality of oxide semiconductor films having crystallinity. Furthermore, a structure in which an oxide semiconductor film having crystallinity and an amorphous oxide semiconductor film are alternately stacked may be employed.

The above structures for making the oxide semiconductor film 403 have a stacked-layer structure of a plurality of layers can be combined as appropriate.

Figure 5B:
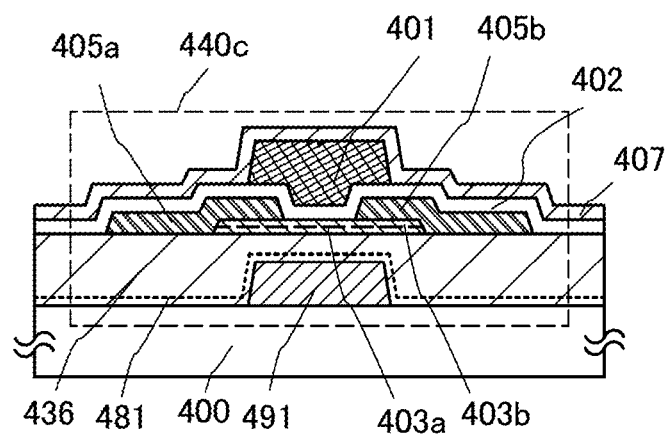

FIG. 5B illustrates an example of a transistor 440c including an oxide semiconductor film having a stacked-layer structure. In the transistor 440c, a stack of a first oxide semiconductor film 403a and a second oxide semiconductor film 403b is provided over the oxide insulating film 436 including the oxygen excess region 481.

Excess oxygen contained in the oxide insulating film 436 might be released when the oxide semiconductor film is formed over the oxide insulating film 436 at high film formation temperature. In the case of stacking the oxide semiconductor films as in the transistor 440c, when an oxide semiconductor film which can be formed at low film formation temperature is used as the first oxide semiconductor film 403a formed in contact with the oxide insulating film 436, and the second oxide semiconductor film is formed while the oxide insulating film 436 is covered with the first oxide semiconductor film, it is possible to prevent release of oxygen from the oxide insulating film 436 even when the film formation temperature of the second oxide semiconductor film is high.

For example, as the first oxide semiconductor film 403a, a CAAC-OS which is an In—Ga—Zn-based oxide with an atomic ratio of In:Ga:Zn=3:1:2 is formed at film formation temperatures ranging from 150° C. to 200° C., and as the second oxide semiconductor film 403b, a CAAC-OS which is an In—Ga—Zn-based oxide with an atomic ratio of In:Ga:Zn=1:1:1 is formed over the first oxide semiconductor film 403a at a film formation temperature of 300° C. The first oxide semiconductor film 403a and the second oxide semiconductor film 403b are processed into an island shape. Thus, the oxide semiconductor film having a stacked-layer structure can be formed.

FIGS. 2A to 2E illustrate an example of a method for manufacturing a semiconductor device including the transistor 440a.

First, a conductive film is formed over the substrate 400 having an insulating surface by a sputtering method, an evaporation method, or the like, and the conductive film is etched, whereby the conductive layer 491 is formed.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a substrate, and then may be separated and transferred to a flexible substrate. To separate the transistor 440a from the substrate and transfer to the flexible substrate, a separation layer may be provided between the substrate and the transistor 440a including the oxide semiconductor film.

The conductive layer 491 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the conductive layer 491. The conductive layer 491 may have a single-layer structure or a stacked-layer structure.

The conductive layer 491 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the conductive layer 491 has a stacked-layer structure of the above conductive material and the above metal material.

As one layer of the conductive layer 491, which is in contact with the oxide insulating film 436, metal oxide containing nitrogen, specifically, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to be positive when used as the gate electrode layer, so that a normally-off switching element can be provided.

The conductive layer 491 may be tapered as in the transistor 440a. The taper angle (the angle between a surface of the substrate 400 and a side surface of the conductive layer 491 in the cross-sectional view of FIG. 1) may be more than or equal to 30° and less than or equal to 70°, for example.

Figure 2A:
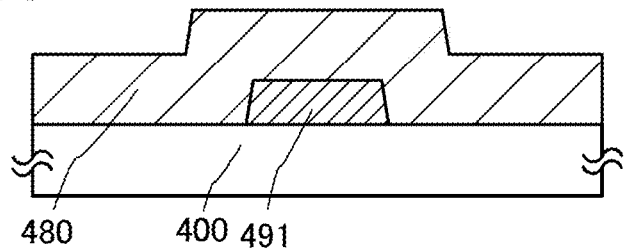
FIGS. 2A to 2E are cross-sectional views illustrating one embodiment of a method for manufacturing a semiconductor device.
Figure 2B:
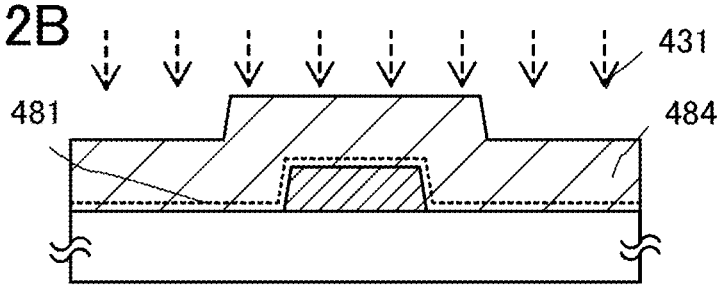
Figure 2C:
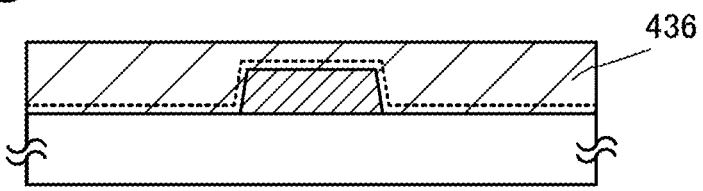

Next, an oxide insulating film 480 is formed over the substrate 400 and the conductive layer 491 (see FIG. 2A). The oxide insulating film 480 has a projection caused by the shape of the conductive layer 491 on its surface.

The oxide insulating film 480 can be formed by a plasma CVD method, a sputtering method, or the like using any of silicon oxide, silicon oxynitride, aluminum oxide, aluminum oxynitride, hafnium oxide, gallium oxide, gallium oxide zinc, and zinc oxide, or a mixed material thereof. The oxide insulating film 480 may have either a single-layer structure or a stacked-layer structure.

In this embodiment, a silicon oxynitride film formed by a plasma CVD method is used as the oxide insulating film 480. Alternatively, a silicon oxide film formed by a sputtering method may be used.

Further, the above-described insulating film functioning as the barrier film may be provided between the substrate 400 and the conductive layer 491 and/or between the conductive layer 491 and the oxide insulating film 480.

As the insulating films functioning as barrier films, for example, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium zinc oxide film, or a zinc oxide film can be used. The inorganic insulating film may have a single-layer structure or a stacked-layer structure. A plasma CVD method, a sputtering method, or a CVD method using a deposition gas can be used to form the insulating films functioning as the barrier films.

Next, treatment for introducing oxygen 431 (oxygen doping treatment) is performed on the oxide insulating film 480 having the projection on its surface, whereby the oxygen excess region 481 is formed in the vicinity of the bottom surface of the oxide insulating film 480 and in the vicinity of the conductive layer 491. Thus, an oxide insulating film 484 including the oxygen excess region 481 is formed (see FIG. 2C). Note that in FIGS. 2B to 2E, the oxygen excess region 481 shown by the dashed line schematically represents the center of the distribution of the introduced oxygen.

At least any of an oxygen radical, an oxygen atom, an oxygen molecule, ozone, an oxygen ion (an oxygen molecular ion) and/or an oxygen cluster ion may be included in the oxygen 431.

Introducing the oxygen 431 into the oxide insulating film 480 can be performed by, for example, an ion implantation method, an ion doping method, a plasma immersion ion implantation method, plasma treatment, or the like. Note that as an ion implantation method, a gas cluster ion beam may be used. The oxygen 431 may be introduced into the entire surface of the substrate 400 at a time. Alternatively, a linear ion beam may be used, for example. In the case of using the linear ion beam, relative movement (scanning) of the substrate or the ion beam enables the oxygen 431 to be introduced into the entire surface of the oxide insulating film 480.

As a supply gas of the oxygen 431, a gas containing oxygen (O) can be used; for example, an $O_2$ gas, an $N_2O$ gas, a $CO_2$ gas, a CO gas, or an $NO_2$ gas can be used. Note that a rare gas (e.g., an Ar gas) may be contained in the supply gas of the oxygen.

Further, in the case where an ion implantation method is used for introducing the oxygen, the dose of the oxygen 431 is preferably greater than or equal to $0.5 \times 10^{16}$ $cm^{-2}$ and less than or equal to $5 \times 10^{16}$ $cm^{-2}$ (e.g., $1 \times 10^{16}$ $cm^{-2}$), and the acceleration energy is preferably more than or equal to 50 eV and less than or equal to 70 eV (e.g., 50 eV). After the oxygen doping treatment, the content of oxygen in the oxide insulating film 436 including the oxygen excess region 481 preferably exceeds that of the stoichiometric composition of the oxide insulating film 436. Note that a region containing oxygen in excess of the stoichiometric composition may exist at least in the oxygen excess region 481. The depth at which the oxygen 431 is implanted may be adjusted as appropriate by implantation conditions.

Next, planarization treatment for removing the projection on the top surface of the oxide insulating film 484 including the oxygen excess region 481 is performed. Part of the oxide insulating film 480 which is over the conductive layer 491 is selectively removed so that the surface is planarized, whereby the planarized oxide insulating film 436 is formed (see FIG. 2C).

Through the planarization treatment, part of the oxide insulating film 484, which is over the conductive layer 491, is selectively removed to be thin, and the distance between part of the oxygen excess region 481, which is over the conductive layer 491, and the top surface of the oxide insulating film 436 is shortened. On the other hand, part of the oxide insulating film 484, in which the conductive layer 491 is not provided, is hardly removed, and thus the oxygen excess region 481 is formed in the vicinity of the bottom surface of the part of the oxide insulating film 436. Consequently, in the oxide insulating film 436, the oxygen excess region is provided in the shallow position of a region where the conductive layer 491 is provided and in the deep position of the other region (i.e., region where the conductive layer is not provided) when seen from the top surface of the oxide insulating film.

Therefore, in the part of the oxide insulating film 436, over which the oxide semiconductor film 403 is provided and which overlaps with the conductive layer 491, the oxygen excess region 481 can be provided close to the oxide semiconductor film 403; thus, oxygen can be efficiently supplied to the oxide semiconductor film 403 from the oxygen excess region 481. Further, heat treatment can promote the supply of oxygen.

Moreover, in the oxide insulating film 436, in a region other than a region under the oxide semiconductor film 403 which requires oxygen supply, the oxygen excess region 481 is provided in the vicinity of the bottom surface of the oxide insulating film 436, which is apart from the top surface of the oxide insulating film 436. Thus, particularly in the case of performing the heat treatment, oxygen can be prevented from being unnecessarily released from the top surface of the oxide insulating film 436, and the oxide insulating film 436 can be kept in an oxygen excess state.

The planarization treatment may be, but not particularly limited to, polishing treatment (such as a chemical mechanical polishing (CMP) method), dry etching treatment, or plasma treatment.

As the plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the oxide insulating film 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on roughness of the surface of the oxide insulating film 436.

Next, the oxide semiconductor film 403 is formed over the oxide insulating film 436.

It is preferable that the oxide semiconductor film 403 contains oxygen in a proportion higher than that of the stoichiometric composition to be supersaturated shortly after the oxide semiconductor film 403 is formed. For example, in the case of forming the oxide semiconductor film 403 by a sputtering method, deposition is preferably performed under such a condition that the proportion of oxygen in a deposition gas is high. In particular, deposition is preferably performed in an oxygen atmosphere (100% oxygen gas). The deposition under the condition where the proportion of oxygen in a deposition gas is high, in particular, in an atmosphere containing an oxygen gas at 100% can reduce release of Zn from the film even when the deposition temperature is, for example, higher than or equal to 300° C.

Note that in this embodiment, a target used for forming the oxide semiconductor film 403 by a sputtering method is, for example, an oxide target having a composition of In:Ga:Zn=3:1:2 [atomic percentage], so that an In—Ga—Zn-based oxide film (IGZO film) is formed.

The relative density (the fill rate) of the metal oxide target is greater than or equal to 90% and less than or equal to 100%, preferably greater than or equal to 95% and less than or equal to 100%. By using the metal oxide target with high relative density, a dense oxide semiconductor film can be formed.

It is preferable that a high-purity gas from which impurities such as hydrogen, water, a hydroxyl group, or hydride are removed be used as a sputtering gas for the deposition of the oxide semiconductor film 403.

The substrate is held in a deposition chamber kept under reduced pressure. Then, a sputtering gas in which impurities such as hydrogen and moisture are sufficiently removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The oxide semiconductor film 403 can be formed by processing a film-shaped oxide semiconductor film into an island-shape oxide semiconductor film by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas of $BCl_3$ and $Cl_2$ ($BCl_3:Cl_2$=60 sccm:20 sccm), a power of 450 W, a bias power of 100 W, and a pressure of 1.9 Pa), so that the IGZO film can be processed into an island shape.

It is preferable that the oxide semiconductor film 403 be highly purified to contain few impurities such as copper, aluminum, and chlorine. In the process for manufacturing the transistor 440a, steps in which these impurities are not mixed or attached to the surface of the oxide semiconductor film 403 are preferably selected as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ atoms/cm$^3$, preferably lower than or equal to $1\times10^{17}$ atoms/cm$^3$. Further, the concentration of aluminum in the oxide semiconductor film 403 is lower than or equal to $1\times10^{18}$ atoms/cm$^3$. Further, the concentration of chlorine in the oxide semiconductor film 403 is lower than or equal to $2\times10^{18}$ atoms/cm$^3$.

Further, heat treatment for increasing the supply of oxygen from the oxide insulating film 436 to the oxide semiconductor film 403 may be performed.

Next, the source electrode layer 405a and the drain electrode layer 405b which are electrically connected to the oxide semiconductor film 403 are formed. A variety of circuits can be formed by connection with another transistor or element with the use of the source electrode layer 405a and the drain electrode layer 405b.

The source electrode layer 405a and the drain electrode layer 405b can be formed in such a manner that, for example, a conductive film is formed by a sputtering method, an evaporation method, or the like, and the conductive film is processed by etching.

As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$), indium zinc oxide ($In_2O_3$—ZnO), or any of these metal oxide materials in which silicon oxide is contained can be used.

Next, the gate insulating film 402 is formed to cover the oxide semiconductor film 403, the source electrode layer 405a, and the drain electrode layer 405b.

Note that a surface of the oxide semiconductor film 403 may also be subjected to the planarization treatment in order to improve the coverage with the gate insulating film 402. The surface of the oxide semiconductor film 403 is preferably flat particularly in the case of using a thin insulating film as the gate insulating film 402. Plasma treatment may be performed on the oxide semiconductor film 403 before the gate insulating film 402 is formed. For example, plasma treatment using a rare gas (e.g., argon), a gas containing O (e.g., an $O_2$ gas, an $N_2O$ gas, a $CO_2$ gas, a CO gas, or an $NO_2$ gas), or the like can be performed.

The gate insulating film 402 has a thickness greater than or equal to 1 nm and less than or equal to 20 nm and can be formed by a sputtering method, an MBE method, a CVD method, a pulsed laser deposition method, an ALD method, or the like as appropriate. The gate insulating film 402 may be formed with a sputtering apparatus which performs deposition on surfaces of a plurality of substrates set substantially perpendicular to a surface of a sputtering target.

The gate insulating film 402 can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. It is preferable that a portion of the gate insulating film 402 which is in contact with the oxide semiconductor film 403 contain oxygen. In particular, the gate insulating film 402 preferably contains a large amount of oxygen which exceeds at least the amount of oxygen of the stoichiometric composition in the film (bulk). In this embodiment, a silicon oxynitride film formed by a CVD method using a microwave is used as the gate insulating film 402. The use of the silicon oxynitride film containing a large amount of oxygen as the gate insulating film 402 makes it possible to supply oxygen to the oxide semiconductor film 403, which leads to favorable characteristics. Moreover, the gate insulating film 402 is preferably formed in consideration of the size of a transistor to be manufactured and the step coverage with the gate insulating film 402.

When the gate insulating film 402 is formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, gate leakage current can be reduced. Further, the gate insulating film 402 may have either a single-layer structure or a stacked-layer structure.

Next, a conductive film is formed over the gate insulating film 402 by a sputtering method, an evaporation method, or the like and then etched, so that the gate electrode layer 401 is formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked-layer structure of the above conductive material and the above metal material.

As a layer on the lowermost surface of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to be positive when used as the gate electrode layer, so that a normally-off switching element can be provided.

Figure 2D:
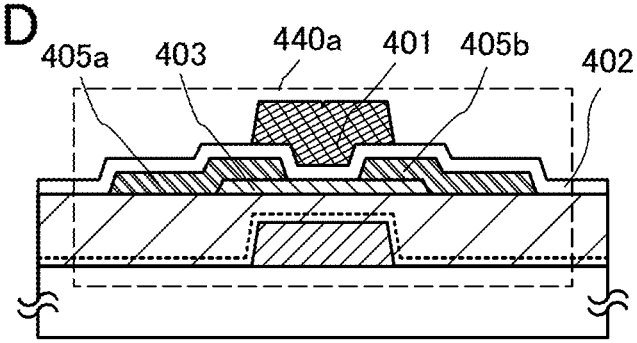

Through the above steps, the transistor 440a of this embodiment can be manufactured (see FIG. 2D).

Further a structure in which the gate electrode layer 401 overlaps with part of the source electrode layer 405a and part of the drain electrode layer 405b or a structure in which the gate electrode layer 401 does not overlap with part of the source electrode layer 405a and part of the drain electrode layer 405b may be employed. In the transistor 440a, the gate electrode layer 401 overlaps with the source electrode layer 405a and the drain electrode layer 405b. With the structure, the transistor 440a can have improved on-state characteristics (e.g., on-state current and field-effect mobility).

Figure 4A:
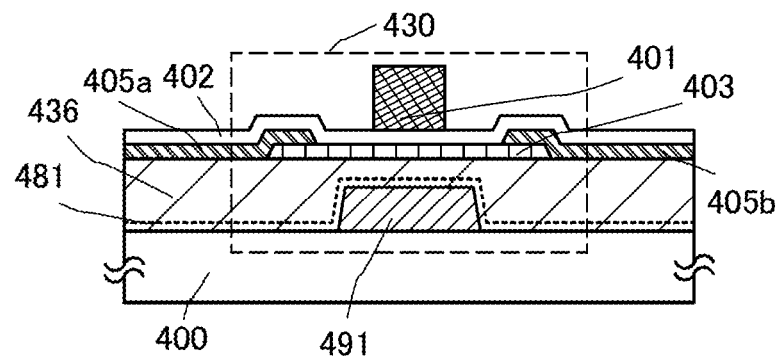
FIGS. 4A to 4C are cross-sectional views each illustrating one embodiment of a semiconductor device.
Figure 4B:
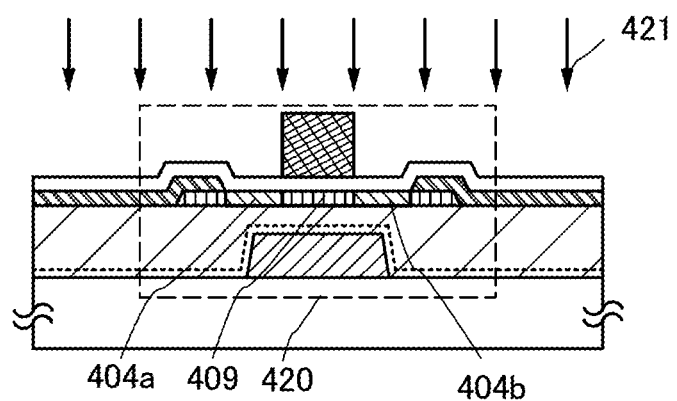
Figure 4C:
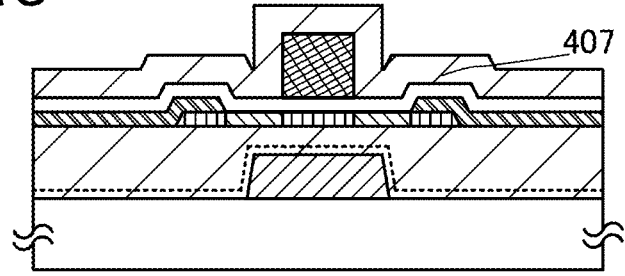

FIGS. 4A to 4C illustrate a transistor 430 and a transistor 420 each having a structure in which the gate electrode layer 401 does not overlap with the source electrode layer 405a and the drain electrode layer 405b.

As illustrated in FIG. 4A, in the transistor 430, the gate electrode layer 401 does not overlap with the source electrode layer 405a and the drain electrode layer 405b, and the oxide semiconductor film 403 includes a region which does not overlap with the gate electrode layer 401, the source electrode layer 405a, and the drain electrode layer 405b. With the structure, the transistor 430 can have small off-state current and excellent off-state characteristics.

In the case where the gate electrode layer does not overlap with the source and drain electrode layers, by introducing a dopant (impurity element) into the oxide semiconductor film 403 in a self-aligned manner with the use of the gate electrode layer 401 as a mask, a pair of low-resistance regions whose resistances are lower than that of a channel formation region and which include the dopant (impurity element) is formed in the oxide semiconductor film 403 so that the channel formation region is provided between the low-resistance regions.

Specifically, a dopant 421 is introduced into the oxide semiconductor film 403 with the use of the gate electrode layer 401 as a mask, whereby low-resistance regions 404a and 404b are formed with a channel formation region 409 provided therebetween (see FIG. 4B).

The dopant is an impurity element by which the electrical conductivity of the oxide semiconductor film 403 is changed. One or more selected from the following can be used as the dopant: Group 15 elements (typical examples thereof are phosphorus (P), arsenic (As), and antimony (Sb)), boron (B), aluminum (Al), tungsten (W), molybdenum (Mo), nitrogen (N), argon (Ar), helium (He), neon (Ne), indium (In), gallium (Ga), fluorine (F), chlorine (Cl), titanium (Ti), and zinc (Zn).

The dopant can be introduced into the oxide semiconductor film 403 through another film (e.g., the gate insulating film 402) by an implantation method. As the method for introducing the dopant, an ion implantation method, an ion doping method, a plasma immersion ion implantation method, or the like can be used. In that case, it is preferable to use a single ion of the dopants, a fluoride ion, or a chloride ion.

The introduction of the dopant may be controlled by setting the introduction conditions such as the accelerated voltage and the dosage, or the thickness of the films through which the dopant passes as appropriate. In this embodiment, phosphorus is used as the dopant, and phosphorus ions are implanted by an ion implantation method. The dosage of the dopant can be set to be greater than or equal to $1 \times 10^{13}$ ions/cm$^2$ and less than or equal to $5 \times 10^{16}$ ions/cm$^2$.

The concentration of the dopant in the low-resistance regions is preferably higher than or equal to $5 \times 10^{18}$/cm$^3$ and lower than or equal to $1 \times 10^{22}$/cm$^3$.

The substrate 400 may be heated in introducing the dopant.

The introduction of the dopant into the oxide semiconductor film 403 may be performed plural times, and plural kinds of dopants may be used. Heat treatment may be performed thereon after the introduction of the dopant.

In this embodiment, phosphorus (P) ions are implanted into the oxide semiconductor film 403 by an ion implantation method. Note that the conditions of the phosphorus (P) ion implantation are as follows: the acceleration voltage is 30 kV and the dosage is $1.0 \times 10^{15}$ ions/cm$^2$.

In the case where the oxide semiconductor film 403 is a CAAC-OS film, part of the oxide semiconductor film 403 becomes amorphous by introduction of the dopant in some cases.

Thus, the oxide semiconductor film 403 including the low-resistance regions 404a and 404b with the channel formation region 409 provided therebetween is formed, whereby the transistor 420 is manufactured.

With the oxide semiconductor film 403 including the low-resistance regions 404a and 404b with the channel formation region 409 provided therebetween in the channel length direction, on-state characteristics (e.g., on-state current and field-effect mobility) of the transistor 420 are increased, which enables high-speed operation and high-speed response of the transistor.

A dense inorganic insulating film (typified by an aluminum oxide film) to be a protective insulating film can be provided over the oxide semiconductor film 403, the gate insulating film 402, and the gate electrode layer 401.

Figure 2E:
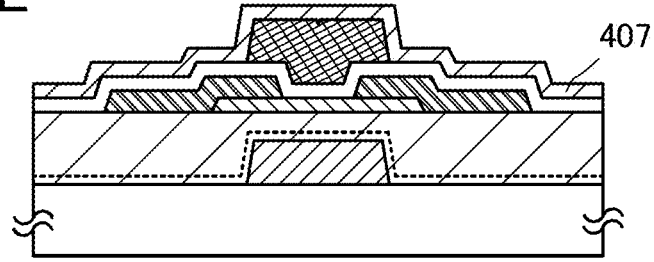

In this embodiment, the insulating film 407 is formed over the oxide semiconductor film 403, the gate insulating film 402, and the gate electrode layer 401 (see FIG. 2E and FIG. 4C).

The insulating film 407 may have either a single-layer structure or a stacked-layer structure and preferably includes at least aluminum oxide.

An aluminum oxide film which can be used as the insulating film 407 has a superior shielding effect (blocking effect), which is not permeable to oxygen and impurities such as hydrogen and moisture.

Therefore, during the manufacturing process and after the manufacture, the insulating film 407 functions as a protective film for preventing entry of impurities such as hydrogen and moisture which might cause a change in electrical characteristics of the transistor into the oxide semiconductor film 403 and release of oxygen which is a main component of the oxide semiconductor from the oxide semiconductor film 403.

The insulating film 407 can be formed by a plasma CVD method, a sputtering method, an evaporation method, or the like. Alternatively, as the insulating film 407, a metal oxide film obtained by performing oxidation treatment on a metal film may be used.

As the insulating film 407, an inorganic insulating film such as a silicon oxide film, a silicon oxynitride film, an aluminum oxynitride film, a gallium oxide, a gallium oxide zinc film, or a zinc oxide film can be typically used as well as the aluminum oxide film. Further, a hafnium oxide film, a magnesium oxide film, a zirconium oxide film, a lanthanum oxide film, a barium oxide film, or a metal nitride film (e.g., a silicon nitride film, a silicon nitride oxide film, or an aluminum nitride film) can be used.

After the formation of the insulating film 407, heat treatment may be performed at a temperature higher than or equal to 300° C. and lower than or equal to 500° C. (e.g., higher than or equal to 400° C. and lower than or equal to 450° C.). The heat treatment enables oxygen included in the oxygen excess region 481 to be diffused into the oxide semiconductor film 403 and to enter the oxide semiconductor film 403. Accordingly, the oxygen included in the oxygen excess region 481 can be supplied to the oxide semiconductor film 403, so that oxygen vacancies can be compensated.

An interlayer insulating film may be formed over the insulating film 407. The interlayer insulating film can be formed using the same material and method as the insulating film 407.

Further, a planarization insulating film may be formed in order to reduce surface roughness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed of any of these materials.

As described above, in the semiconductor device which includes the transistors 440a, 440b, 440c, 420, or 430 including the oxide semiconductor film, stable electrical characteristics can be provided and high reliability can be achieved.

Embodiment 2

In this embodiment, examples of a semiconductor device using the transistor described in this specification are described with reference to FIGS. 6A and 6B, FIG. 7, and FIGS. 15A to 15C.

Figure 6A:
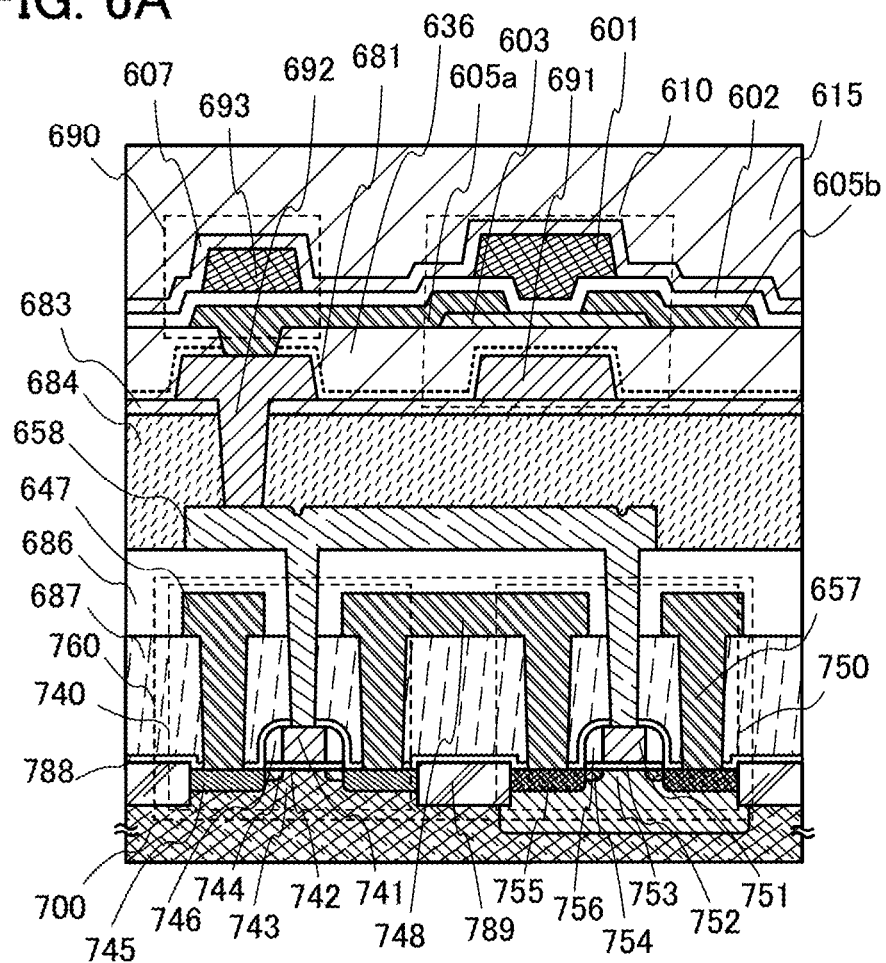
FIGS. 6A and 6B are a cross-sectional view and a circuit diagram illustrating one embodiment of a semiconductor device.
Figure 6B:
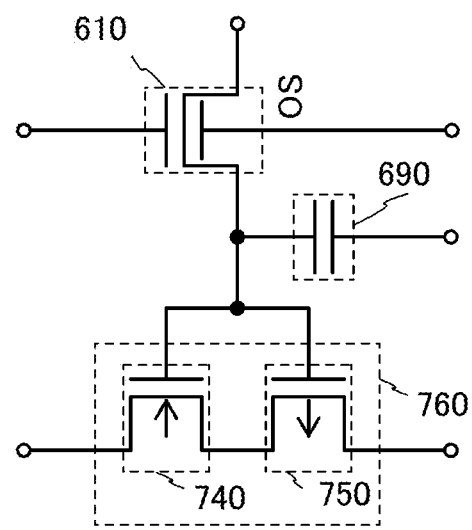

A semiconductor device illustrated in FIGS. 6A and 6B includes transistors 740 and 750 in its lower portion and a transistor 610 in its upper portion. A semiconductor device illustrated in FIG. 7 includes transistors 640 and 650 in its lower portion and the transistor 610 in its upper portion. A first semiconductor material is used in the transistors 740, 750, 640, and 650. A second semiconductor material is used in the transistor 610. The transistor 610 has the same structure as the transistor 440a described in Embodiment 1. Note that FIG. 6B is a circuit diagram of the semiconductor device illustrated in FIG. 6A.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can easily operate at high speed. On the other hand, charge can be held in a transistor including an oxide semiconductor for a long time owing to its characteristics.

Examples of a substrate which can be used for the semiconductor devices include a single crystal semiconductor substrate and a polycrystalline semiconductor substrate made of silicon, silicon carbide, or the like, a compound semiconductor substrate made of silicon germanium or the like, an SOI (silicon on insulator) substrate, and the like. A channel formation region of the transistor can be formed in or on any of these substrates. The semiconductor device illustrated in FIG. 6A is an example of forming a channel formation region in a substrate to manufacture a transistor in a lower portion.

In the semiconductor device illustrated in FIG. 6A, a single crystal silicon substrate is used as a substrate 700, the transistors 740 and 750 are formed on the single crystal silicon substrate, and a single crystal silicon is used for the first semiconductor material. The transistor 740 is an n-channel transistor and the transistor 750 is a p-channel transistor. The transistors 740 and 750 are electrically connected to each other to form a complementary metal oxide semiconductor (CMOS) circuit 760.

Note that in this embodiment, since the single crystal silicon substrate having p-type conductivity is used as the substrate 700, an impurity element imparting n-type conductivity is added to a formation region of the transistor 750 that is the p-channel transistor to form an n well. A channel formation region 753 of the transistor 750 is formed in the n well. As the impurity element imparting n-type conductivity, phosphorus (P), arsenic (As), or the like can be used.

Therefore, an impurity element imparting p-type conductivity is not added to a formation region of the transistor 740 that is the n-channel transistor; however, a p well may be formed by adding an impurity element imparting p-type conductivity. As the impurity element imparting p-type conductivity, boron (B), aluminum (Al), gallium (Ga), or the like can be used.

On the other hand, in the case of using a single crystal silicon substrate having n-type conductivity, an impurity element imparting p-type conductivity may be added to form a p-well.

The transistor 740 includes a channel formation region 743, n-type impurity regions 744 functioning as lightly doped drain (LDD) regions, n-type impurity regions 745 functioning as a source region and a drain region, a gate insulating film 742, and a gate electrode layer 741. Sidewall insulating layers 746 are provided on side surfaces of the gate electrode layer 741. The n-type impurity regions 744 and the n-type impurity regions 745 having different impurity concentrations can be formed in a self-aligned manner by using the gate electrode layer 741 and the sidewall insulating layers 746 as masks.

The transistor 750 includes the channel formation region 753, p-type impurity region 754 functioning as LDD regions, p-type impurity regions 755 functioning as a source region and a drain region, a gate insulating film 752, and a gate electrode layer 751. Sidewall insulating layers 756 are provided on side surfaces of the gate electrode layer 751. The p-type impurity regions 754 and the p-type impurity regions 755 having different impurity concentrations can be formed in a self-aligned manner by using the gate electrode layer 751 and the sidewall insulating layers 756 as masks.

In the substrate 700, an element separation region 789 separates the transistor 740 and the transistor 750, and insulating films 788 and 687 are stacked over the transistor 740 and the transistor 750. In openings formed in the insulating films 788 and 687, a wiring layer 647 in contact with the n-type impurity region 745, a wiring layer 657 in contact with the p-type impurity region 755, and a wiring layer 748 which is in contact with the n-type impurity region 745 and the p-type impurity region 755 and electrically connects the transistors 740 and 750 in the source region and the drain region are formed.

An insulating film 686 is provided over the insulating film 687, the wiring layer 647, the wiring layer 748, and the wiring layer 657. Over the insulating film 686, a wiring layer 658 which is in contact with and electrically connects the gate electrode layers 741 and 751 through openings formed in the insulating films 788, 687, and 686 is formed.

Figure 7:
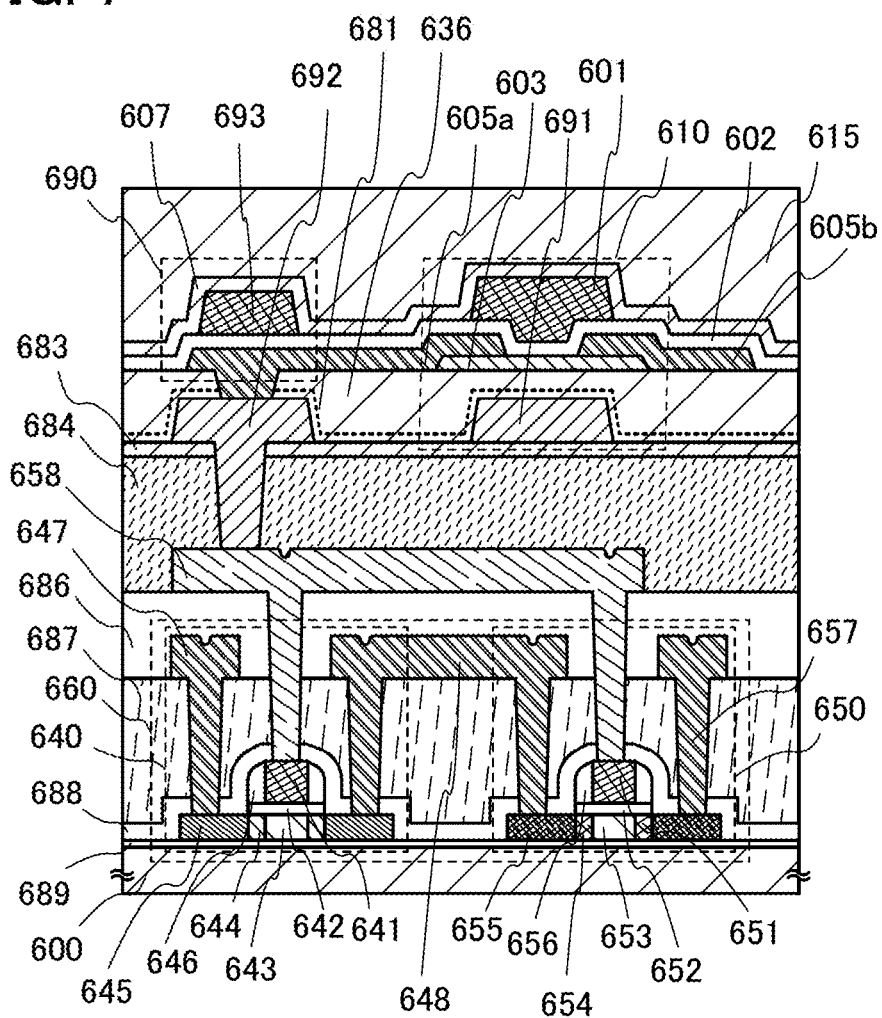
FIG. 7 is a cross-sectional view illustrating one embodiment of a semiconductor device.

FIG. 7 illustrates another example of transistors in the lower portion, which are different from the transistors in FIG. 6A. The semiconductor device illustrated in FIG. 7 is an example of forming a semiconductor film including an island-shaped channel formation region over a substrate to manufacture a transistor in the lower portion.

In the semiconductor device illustrated in FIG. 7, the transistors 740 and 750 each including an island-shaped semiconductor film are provided over a substrate 600 provided with an insulating film 689. An SOI substrate may be used for the substrate 600, the insulating film 689, and the semiconductor film, or a semiconductor film may be formed over the substrate 600 provided with the insulating film 689 and processed into an island shape. Alternatively, a semiconductor film provided on a manufacturing substrate may be transferred to the substrate 600 to form the semiconductor film over the substrate 600 with the insulating film 689 which is used as a bonding layer provided therebetween.

In this embodiment, a single crystal silicon film obtained by separating a semiconductor film from a single crystal silicon substrate and transferring it over the insulating film 689 is used as the first semiconductor material. The transistor 640 is an n-channel transistor and the transistor 650 is a p-channel transistor. The transistors 640 and 650 are electrically connected to each other to form a CMOS circuit 660.

The transistor 640 includes a channel formation region 643, n-type impurity regions 644 functioning as LDD regions, n-type impurity regions 645 functioning as a source region and a drain region, a gate insulating film 642, and a gate electrode layer 641. Sidewall insulating layers 646 are provided on side surfaces of the gate electrode layer 641. The n-type impurity regions 644 and the n-type impurity regions 645 having different impurity concentrations can be formed in a self-aligned manner by using the gate electrode layer 641 and the sidewall insulating layers 646 as masks.

The transistor 650 includes a channel formation region 653, p-type impurity regions 654 functioning as LDD regions, p-type impurity regions 655 functioning as a source region and a drain region, a gate insulating film 652, and a gate electrode layer 651. Sidewall insulating layers 656 are provided on side surfaces of the gate electrode layer 651. The p-type impurity regions 654 and the p-type impurity regions 655 having different impurity concentrations can be formed in a self-aligned manner by using the gate electrode layer 651 and the sidewall insulating layers 656 as masks.

The island-shaped semiconductor films of the transistors 640 and 650 are provided separately from each other, and an insulating film 688 and the insulating film 687 are stacked over the transistors 640 and 650. In openings formed in the insulating films 688 and 687, the wiring layer 647 in contact with the n-type impurity region 645, the wiring layer 657 in contact with the p-type impurity region 655, and a wiring layer 648 which is in contact with the n-type impurity region 645 and the p-type impurity region 655 and electrically connects the transistors 640 and 650 in the source region or the drain region are formed.

The insulating film 686 is provided over the insulating film 687, the wiring layer 647, the wiring layer 648, and the wiring layer 657. Over the insulating film 686, the wiring layer 658 which is in contact with and electrically connects the gate electrode layers 641 and 651 through openings formed in the insulating films 688, 687, and 686 is formed.

However, the semiconductor device of this embodiment is not limited to this, and a transistor having a silicide (salicide (self-aligned silicide)) or a transistor which does not have sidewall insulating layers may be used as the transistors 740, 750, 640, and 650. With a structure having a silicide (salicide), resistance of the source region and the drain region can be lowered and the speed of the semiconductor device can be increased. In addition, the semiconductor device can operate at low voltage, and thus the power consumption thereof can be reduced.

Next, description is given of an element structure in the upper portion provided over the transistors in the lower portion of the semiconductor device in FIG. 6A or FIG. 7.

An insulating film 684 and an insulating film 683 are stacked over the insulating film 686 and the wiring layer 658. A conductive layer 691 and a wiring layer 692 are formed over the insulating film 683. The wiring layer 692 is in contact with and electrically connected to the wiring layer 658 in an opening formed in the insulating films 684 and 683. In this embodiment, planarization treatment by a CMP method is performed on the insulating film 684, and the insulating film 683 is formed over the planarized insulating film 684. In the semiconductor device, the insulating film 683 is provided between the lower portion and the upper portion, and functions as a barrier film to prevent impurities such as hydrogen, which cause deterioration or a change in electrical characteristics of the transistor 610 in the upper portion, from entering the upper portion from the lower portion. Therefore, a dense inorganic insulating film having a high function of blocking impurities and the like (e.g., an aluminum oxide film or a silicon nitride film) is preferably used.

The transistor 610 can be manufactured by the same method as the transistor 440a. The method for manufacturing the transistor 610 is briefly described.

An oxide insulating film which covers the conductive layer 691 and the wiring layer 692 and has projections with shapes which reflect the shapes of the conductive layer 691 and the wiring layer 692 on its surface is formed, and oxygen is injected into the oxide insulating film by oxygen doping treatment to form an oxygen excess region 681 in the vicinity of the bottom surface of the oxide insulating film and in the vicinity of the conductive layer 691 and the wiring layer 692. The oxide insulating film including the oxygen excess region 681 is subjected to CMP treatment, whereby part of the oxide insulating film which is over the conductive layer 691 and the wiring layer 692 is selectively removed to planarize the surface; thus, a planarized oxide insulating film 636 is formed.

The oxide semiconductor film 603 is formed over a region of the oxide insulating film 636 which overlaps with the conductive layer 691. Electrode layers 605a and 605b functioning as source and drain electrode layers are formed over the oxide semiconductor film 603. The electrode layer 605a is electrically connected to the wiring layer 692 in an opening which is provided in the oxide insulating film 636 and reaches the wiring layer 692. Thus, the electrode layer 605a is electrically connected to the gate electrode layers 741 and 751 (the gate electrode layers 641 and 651 in FIG. 7) through the wiring layers 692 and 658.

A gate insulating film 602 is formed over the electrode layer 605a, the electrode layer 605b, and the oxide semiconductor film 603, and a gate electrode layer 601 and a conductive layer 693 are formed over the gate insulating film 602; thus, the transistor 610 and a capacitor 690 are formed. In addition, insulating films 607 and 615 are formed over the transistor 610 and the capacitor 690.

The capacitor 690 includes the electrode layer 605a, the gate insulating film 602, and the conductive layer 693 which are provided to overlap with each other. The electrode layer 605a of the transistor 610 functions as one electrode of the capacitor 690 and the conductive layer 693 functions as the other electrode of the capacitor 690.

The transistor 610 is a top-gate transistor in which the oxide semiconductor film is used for a channel formation region. The conductive layer 691 is provided to overlap with the channel formation region in the oxide semiconductor film 603 and the gate electrode layer 601 of the transistor 610, and can control the electrical characteristics of the transistor 610. In addition, the conductive layer 691 has a function of blocking static electricity caused by a circuit portion including the transistors 740 and 750 (the transistors 640 and 650 in FIG. 7) in the lower portion.

In part of the oxide insulating film 636, over which the oxide semiconductor film 603 is provided and which overlaps with the conductive layer 691, the oxygen excess region 681 can be provided close to the oxide semiconductor film 603; thus, oxygen can be efficiently supplied to the oxide semiconductor film 603 from the oxygen excess region 681. Further, heat treatment can promote the supply of oxygen.

Moreover, in the oxide insulating film 636, in a region other than the region under the oxide semiconductor film 603 which requires oxygen supply, the oxygen excess region 681 is provided in the vicinity of the bottom surface of the oxide insulating film 636, which is apart from the top surface of the oxide insulating film 636. Thus, particularly in the case of performing the heat treatment, oxygen can be prevented from being unnecessarily released from the top surface of the oxide insulating film 636, and the oxide insulating film 636 can be kept in an oxygen excess state.

Accordingly, in the transistor 610, oxygen vacancies in the oxide semiconductor film 603, at the interface between the gate insulating film 602 and the oxide semiconductor film 603, and the like can be compensated efficiently.

In the transistor 610, by setting the potential of the conductive layer 691 to GND, the threshold voltage of the transistor 610 can be more positive and thus, the transistor 610 can serve as a normally-off transistor.

Further, as in the semiconductor device in FIGS. 3A to 3C described in Embodiment 1, the insulating films 683 and 607 functioning as barrier films may be in contact with each other around the oxide insulating film 636 and the transistor 610 to surround the oxide insulating film 636 including the oxygen excess region 681 and the transistor 610. In such a case, it is preferable that the conductive layer 691, the electrode layer 605a, the electrode layer 605b, and the gate electrode layer 601 be electrically connected to the outside at a place located as far apart as possible from the oxide semiconductor film 603. Around the oxide semiconductor film 603, upper and lower edge portions of the oxide insulating film 636 including the oxygen excess region 681 and the gate insulating film 602 are covered with the insulating films 683 and 607; thus, the effect of preventing release of oxygen and entry of impurities such as hydrogen and moisture is more enhanced. Consequently, favorable electrical characteristics of the transistor 610 can be kept for a long time, which makes it possible to provide a highly reliable semiconductor device.

Figure 15A:
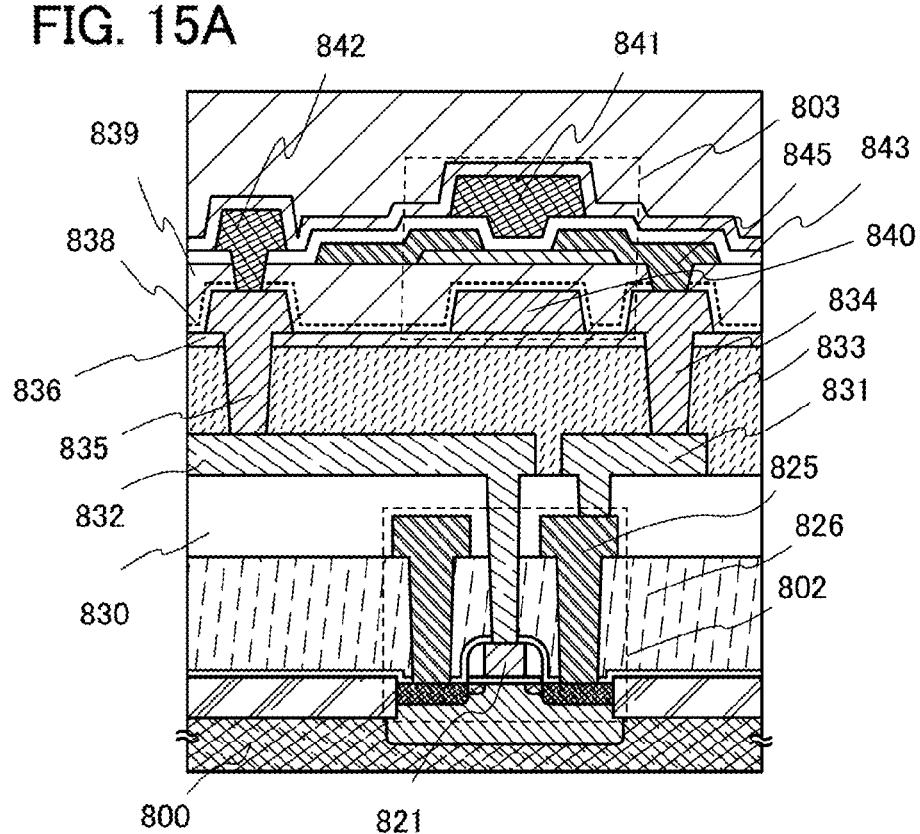
FIGS. 15A to 15C are a cross-sectional view and circuit diagrams illustrating one embodiment of a semiconductor device.
Figure 15B:
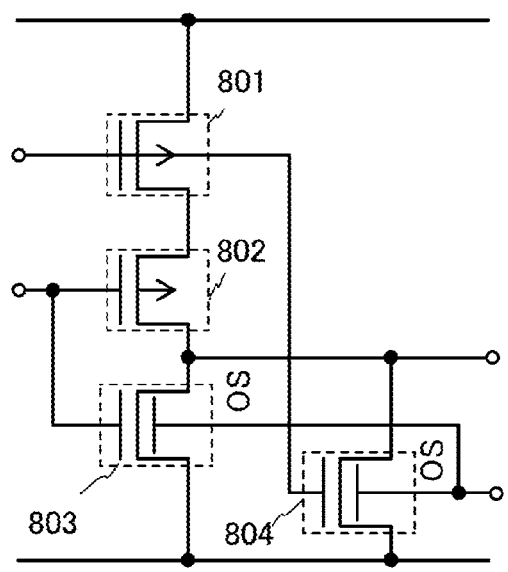
Figure 15C:
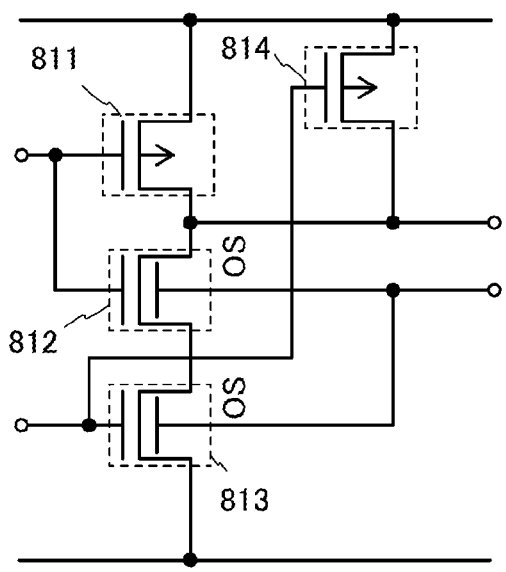

As other examples of the semiconductor device using the transistor described in this specification, a NOR circuit and a NAND circuit which are logic circuits are illustrated in FIGS. 15A to 15C. FIG. 15B is the NOR circuit and FIG. 15C is the NAND circuit. FIG. 15A is a cross-sectional view of transistors 802 and 803 in the NOR circuit in FIG. 15B.

In the NOR circuit and the NAND circuit illustrated in FIGS. 15A to 15C, each of a transistor 801, the transistor 802, a transistor 811, and a transistor 814 that are p-channel transistors is a transistor which has the same structure as the transistor 750 illustrated in FIG. 6A and in which a single crystal silicon substrate is used for a channel formation region. Each of the transistor 803, a transistor 804, a transistor 812, and a transistor 813 that are n-channel transistors is a transistor which has the same structure as the transistor 610 illustrated in FIG. 6A and the transistor 440a described in Embodiment 1 and in which an oxide semiconductor film is used for a channel formation region.

In the NOR circuit and the NAND circuit illustrated in FIGS. 15A to 15C, conductive layers controlling electrical characteristics of the transistors are provided to overlap with gate electrode layers with oxide semiconductor films provided therebetween in the transistors 803, 804, 812, and 813. For example, by setting the potential of the conductive layers to GND, the threshold voltage of the transistors 803, 804, 812, and 813 can be more positive and thus, the transistors 803, 804, 812, and 813 can serve as normally-off transistors. Note that in this embodiment, the conductive layers which are provided in the transistors 803 and 804 and can function as back gates are electrically connected to each other in the NOR circuit, and the conductive layers which are provided in the transistors 812 and 813 and can function as back gates are electrically connected to each other in the NAND circuit. However, one embodiment of the present invention is not limited to this structure, and the conductive layers functioning as back gates may be individually electrically controlled.

In the semiconductor device illustrated in FIG. 15A, a single crystal silicon substrate is used as a substrate 800, the transistor 802 is formed in the single crystal silicon substrate, and the transistor 803 in which an oxide semiconductor film is used for a channel formation region is stacked over the transistor 802.

A gate electrode layer 821 of the transistor 802 is electrically connected to a conductive layer 842 electrically connected to a gate electrode layer 841 of the transistor 803, through wiring layers 832 and 835. The wiring layer 832 is provided in an opening formed in insulating films 826 and 830, the wiring layer 835 is provided in an opening formed in insulating films 833 and 836, and the conductive layer 842 is provided in an opening formed in an oxide insulating film 839 and an insulating film 843.

An electrode layer 825 of the transistor 802 is electrically connected to an electrode layer 845 of the transistor 803, through wiring layers 831 and 834. The wiring layer 831 is provided in an opening formed in the insulating film 830, the wiring layer 834 is provided in an opening formed in insulating films 833 and 836, and the electrode layer 845 is provided in an opening formed in the oxide insulating film 839.

In part of the oxide insulating film 839, over which the oxide semiconductor film is provided and which overlaps with the conductive layer 840, an oxygen excess region 838 can be provided close to the oxide semiconductor film; thus, oxygen can be efficiently supplied to the oxide semiconductor film from the oxygen excess region 838. Further, heat treatment can promote the supply of oxygen.

Moreover, in the oxide insulating film 839, in a region other than a region under the oxide semiconductor film which requires oxygen supply, the oxygen excess region 838 is provided in the vicinity of the bottom surface of the oxide insulating film 839, which is apart from the top surface of the oxide insulating film 839. Thus, particularly in the case of performing the heat treatment, oxygen can be prevented from being unnecessarily released from the top surface of the oxide insulating film 839, and the oxide insulating film 839 can be kept in an oxygen excess state.

Accordingly, in the transistor 803, oxygen vacancies in the oxide semiconductor film, at the interface between the insulating film 843 and the oxide semiconductor film, and the like can be compensated efficiently. The transistors 804, 812, and 813 have the same structure as the transistor 803, and thus have the same effect as the transistor 803.

In the semiconductor device in this embodiment, the transistor in which an oxide semiconductor is used for the channel formation region and which has extremely small off-state current is employed; therefore, power consumption can be sufficiently reduced.

Further, with a stack of semiconductor elements using different semiconductor materials, a miniaturized and highly integrated semiconductor device with stable electrical characteristics and a method for manufacturing the semiconductor device can be provided.

The structures, methods, and the like described in this embodiment can be combined as appropriate with any of the other structures, methods, and the like described in the other embodiments.

Embodiment 3

In this embodiment, an example of a semiconductor device (memory device) which includes the transistor described in this specification, which can hold stored data even when not powered, and which has an unlimited number of write cycles is described with reference to drawings.

Figure 9A:
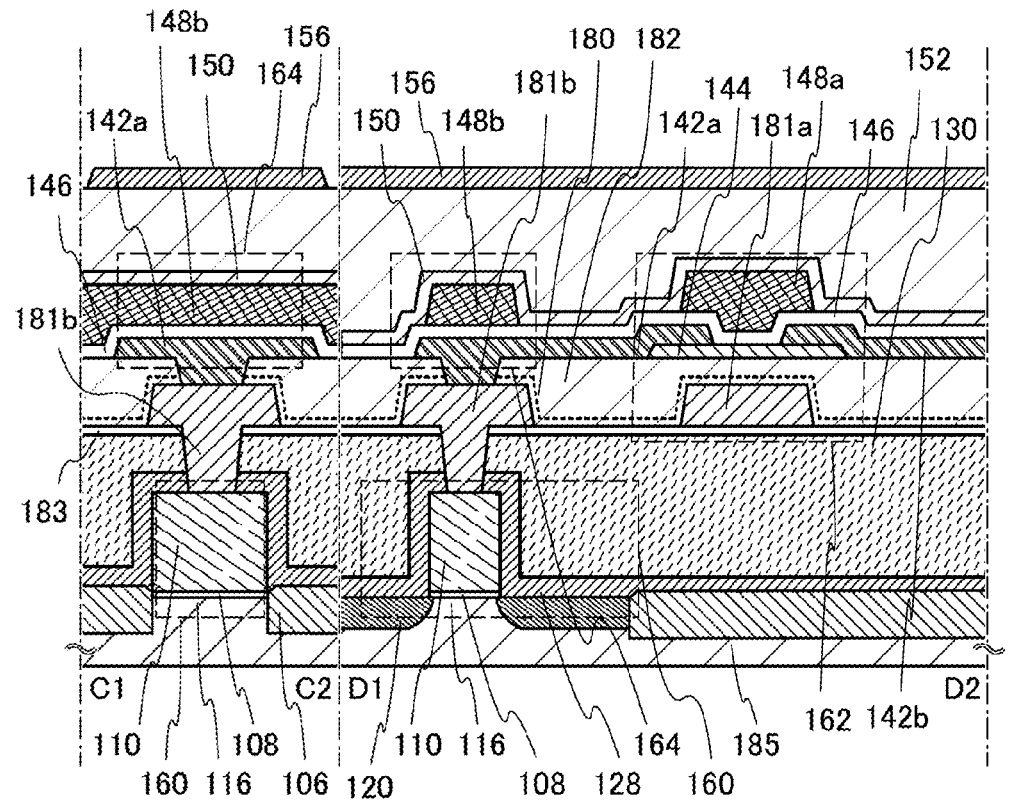
FIGS. 9A to 9C are a cross-sectional view, a plan view, and a circuit diagram of one embodiment of a semiconductor device.
Figure 9B:
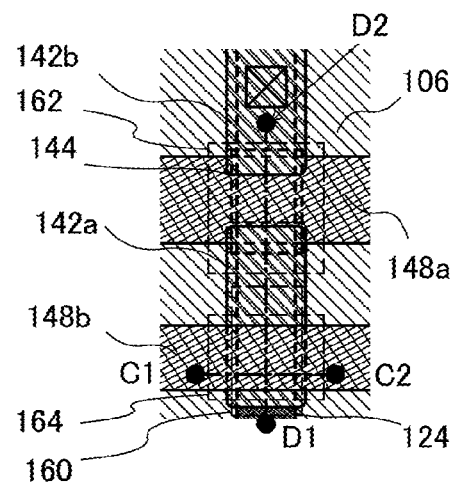
Figure 9C:
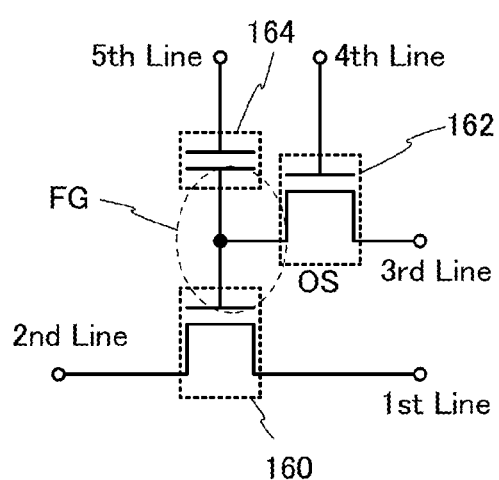

FIGS. 9A to 9C illustrate an example of a structure of the semiconductor device. FIGS. 9A, 9B, and 9C illustrate a cross-sectional view, a plan view, and a circuit diagram, respectively, of the semiconductor device. Here, FIG. 9A corresponds to cross sections taken along the line C1-C2 and the line D1-D2 in FIG. 9B.

The semiconductor device illustrated in FIGS. 9A and 9B includes a transistor 160 including a first semiconductor material in a lower portion, and a transistor 162 including a second semiconductor material in an upper portion. For the transistor 162, the structure of the transistor 440a described in Embodiment 1 is employed as an example.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor for holding data.

The transistor 160 in FIG. 9A includes a channel formation region 116 provided in a substrate 185 containing a semiconductor material (e.g., silicon), impurity regions 120 so that the channel formation region 116 is provided therebetween, a gate insulating film 108 provided over the channel formation region 116, and a gate electrode layer 110 provided over the gate insulating film 108. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer.

An element isolation insulating layer 106 is formed over the substrate 185 to surround the transistor 160, and insulating layers 128 and 130 are formed over the transistor 160.

The transistor 160 formed using a single crystal semiconductor substrate can operate at high speed. Thus, the use of the transistor as a reading transistor enables reading of data at high speed. As treatment prior to formation of the transistor 162 and a capacitor 164, CMP treatment is performed on the insulating layers covering the transistor 160 to planarize the insulating layers, and an insulating film 183 is formed over the planarized insulating layer 130. As the insulating film 183, a dense film having a strong effect of blocking impurities such as hydrogen from a circuit portion including the transistor 160 in the lower portion is preferably used. For example, an aluminum oxide film or a silicon nitride film can be used.

An opening reaching the gate electrode layer 110 is formed in the insulating layer 128, the insulating layer 130, and the insulating film 183, and a conductive layer 181b is formed in contact with the gate electrode layer 110. In the same step as the formation of the conductive layer 181b, a conductive layer 181a is formed.

An oxide insulating film which covers the conductive layers 181a and 181b and has projections with shapes which reflect the shapes of the conductive layers 181a and 181b on its surface is formed, and oxygen is injected into the oxide insulating film by oxygen doping treatment to form an oxygen excess region 180 in the vicinity of the bottom surface of the oxide insulating film and the vicinity of the conductive layers 181a and 181b. The oxide insulating film including the oxygen excess region 180 is subjected to CMP treatment, whereby the oxide insulating film over the conductive layers 181a and 181b is selectively removed to planarize the surface; thus, a planarized oxide insulating film 182 is formed.

An oxide semiconductor film 144 is formed over a region of the oxide insulating film 182 which overlaps with the conductive layer 181a. Electrode layers 142a and 142b are formed over the oxide semiconductor film 144. The electrode layer 142a is electrically connected to the conductive layer 181b in an opening which is provided in the oxide insulating film 182 and reaches the wiring layer 181b. Thus, the electrode layer 142a is electrically connected to the gate electrode layer 110 with the conductive layer 181b provided therebetween.

A gate insulating film 146 is formed over the electrode layer 142a, the electrode layer 142b, and the oxide semiconductor film 144, and a gate electrode layer 148a and a conductive layer 148b are formed over the gate insulating film 146; thus, the transistor 162 and the capacitor 164 are formed. In addition, an insulating film 150 is formed over the transistor 162 and the capacitor 164.

The capacitor 164 includes the electrode layer 142a, the gate insulating film 146, and the conductive layer 148b which overlap with each other. The electrode layer 142a of the transistor 162 functions as one electrode of the capacitor 164 and the conductive layer 148b functions as the other electrode of the capacitor 164. Note that the capacitor 164 may be omitted if a capacitor is not needed. Alternatively, the capacitor 164 may be separately provided above the transistor 162.

An insulating film 152 is provided over the transistor 162 and the capacitor 164. In addition, a wiring 156 for connecting the transistor 162 to another transistor is provided over the insulating film 152. Although not illustrated in FIG. 9A, the wiring 156 is electrically connected to the electrode layer 142b through an electrode layer formed in an opening provided in the insulating film 152, the insulating film 150, the gate insulating film 146, and the like.

The transistor 162 illustrated in FIG. 9A is a top-gate transistor in which the oxide semiconductor film 144 is used for a channel formation region. The conductive layer 181a is provided to overlap with the channel formation region of the oxide semiconductor film and the gate electrode layer 148a of the transistor 162, and can control the electrical characteristics of the transistor 162. In addition, the conductive layer 181b has a function of blocking static electricity caused by a circuit portion including the transistor 160 in the lower portion.

In part of the oxide insulating film 182, over which the oxide semiconductor film 144 is provided and which overlaps with the conductive layer 181a, an oxygen excess region 180 can be provided close to the oxide semiconductor film 144; thus, oxygen can be efficiently supplied to the oxide semiconductor film 144 from the oxygen excess region 180. Further, heat treatment can promote the supply of oxygen.

Moreover, in the oxide insulating film 182, in a region other than the region under the oxide semiconductor film 144 which requires oxygen supply, the oxygen excess region 180 is provided in the vicinity of the bottom surface of the oxide insulating film 182, which is apart from the top surface of the oxide insulating film 182. Thus, particularly in the case of performing the heat treatment, oxygen can be prevented from being unnecessarily released from the top surface of the oxide insulating film 182, and the oxide insulating film 182 can be kept in an oxygen excess state.

Accordingly, in the transistor 162, oxygen vacancies in the oxide semiconductor film 144, at the interface between the gate insulating film 146 and the oxide semiconductor film 144, and the like can be compensated efficiently.

In the transistor 162, by setting the potential of the conductive layer 181a to GND, the threshold voltage of the transistor 162 can be more positive and thus, the transistor 162 can be a normally-off transistor.

Thus, the off-state current of the transistor 162 can be small, and with the use of the transistor 162, stored data can be held for a long time. In other words, refresh operation becomes unnecessary or the frequency of the refresh operation in the semiconductor device can be extremely lowered, which leads to a sufficient reduction in power consumption.

In FIGS. 9A and 9B, the transistor 160 and the transistor 162 at least partly overlap with each other; it is preferable that a source region or a drain region of the transistor 160 overlap with part of the oxide semiconductor film 144. Further, the transistor 162 and the capacitor 164 at least partly overlap with the transistor 160. For example, the conductive layer 148b of the capacitor 164 at least partly overlaps with the gate electrode layer 110 of the transistor 160. With such a planar layout, the area occupied by the semiconductor device can be reduced; thus, higher integration can be achieved.

Next, an example of a circuit configuration corresponding to FIGS. 9A and 9B is illustrated in FIG. 9C.

In FIG. 9C, a first wiring (1st Line) is electrically connected to a source electrode layer of the transistor 160. A second wiring (2nd Line) is electrically connected to a drain electrode layer of the transistor 160. A third line (3rd Line) is electrically connected to one of a source electrode layer and a drain electrode layer of the transistor 162. A fourth line (4th Line) is electrically connected to a gate electrode layer of the transistor 162. The gate electrode layer of the transistor 160 and the other of the source electrode layer and the drain electrode layer of the transistor 162 are electrically connected to one electrode of the capacitor 164. A fifth wiring (5th line) is electrically connected to the other electrode of the capacitor 164.

The semiconductor device in FIG. 9C utilizes a feature in which the potential of the gate electrode layer of the transistor 160 can be held, and thus enables writing, holding, and reading of data as follows.

Description is given of writing and holding of data. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supplying either of two different potential levels (hereinafter referred to as low-level charge and high-level charge) is given. Then, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, description is given of reading of data. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level potential is given to the gate electrode layer of the transistor 160 is lower than an apparent threshold voltage $V_{th\_L}$ in the case where the low-level charge is given to the gate electrode layer of the transistor 160. Here, the apparent threshold voltage refers to the potential of the fifth line, which is needed to turn on the transistor 160. Thus, the potential of the fifth wiring is set to a potential $V_0$ which is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth line.

FIG. 10 illustrates an example of one embodiment of a structure of a memory device different from the above-described memory device.

FIG. 10 is a perspective view of a memory device. The memory device illustrated in FIG. 10 includes a plurality of layers of memory cell arrays (memory cell arrays 3400(1) to 3400(n) (n is an integer greater than or equal to 2)) each including a plurality of memory cells as memory circuits in an upper portion, and a logic circuit 3004 in a lower portion which is necessary for operating the memory cell arrays 3400 (1) to 3400(n).

FIG. 10 illustrates the logic circuit 3004, the memory cell array 3400(1), and the memory cell array 3400(2), and illustrates a memory cell 3170a and a memory cell 3170b as typical examples among the plurality of memory cells included in the memory cell array 3400(1) and the memory cell array 3400(2). The memory cell 3170a and the memory cell 3170b can have a configuration similar to the circuit configuration described in this embodiment and illustrated in FIG. 9C, for example.

Note that as transistors included in the memory cells 3170a and 3170b, a transistor in which a channel formation region is formed in an oxide semiconductor film is used. The structure of the transistor in which the channel formation region is formed in the oxide semiconductor film is the same as the structure described in Embodiment 1, and thus the description of the structure is omitted.

The logic circuit 3004 includes a transistor in which a semiconductor material other than an oxide semiconductor is used for a channel formation region. For example, a transistor obtained by providing an element isolation insulating layer on a substrate containing a semiconductor material (e.g., silicon) and forming a region serving as the channel formation region in a region surrounded by the element isolation insulating layer can be used. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(n) and the logic circuit 3004 are stacked with interlayer insulating layers provided therebetween, and are electrically connected to each other as appropriate through electrodes and wirings which penetrate the interlayer insulating layers, for example.

By applying a transistor in which an oxide semiconductor is used for a channel formation region and which has extremely small off-state current to the semiconductor device in this embodiment, the semiconductor device can store data for an extremely long time. That is, refresh operation is unnecessary or the frequency of refresh operation is extremely low, leading to a sufficient reduction in power consumption. Further, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device of one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly integrated semiconductor device having high electrical characteristics and a method for manufacturing the semiconductor device can be provided.

The structures, methods, and the like described in this embodiment can be combined as appropriate with any of the other structures, methods, and the like described in the other embodiments.

Embodiment 4

In this embodiment, a central processing unit (CPU) at least part of which includes the transistor disclosed in Embodiment 1 is described as an example of a semiconductor device.

Figure 11A:
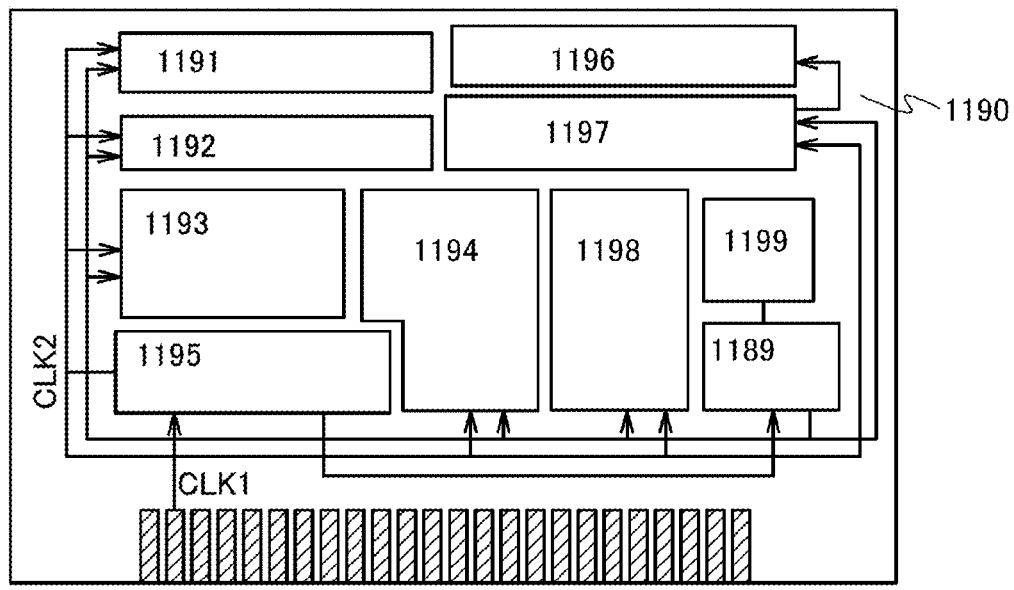
FIGS. 11A to 11C are block diagrams illustrating one embodiment of a semiconductor device.

FIG. 11A is a block diagram illustrating a specific structure of a CPU. The CPU illustrated in FIG. 11A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 11A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls on the basis of the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 11A, a memory cell is provided in the register 1196. The memory cell disclosed in Embodiment 3 can be used as the memory cell in the register 1196.

In the CPU illustrated in FIG. 11A, the register controller 1197 selects operation of holding data in the register 1196 in accordance with an instruction from the ALU 1191. That is, the register controller 1197 selects whether data is held by a logic element which inverts a logic (logic level) or a capacitor in the memory cell included in the register 1196. When data holding by the logic element which inverts a logic (logic level) is selected, power supply voltage is supplied to the memory cell in the register 1196. When data holding by the capacitor is selected, the data is rewritten in the capacitor, and supply of power supply voltage to the memory cell in the register 1196 can be stopped.

Figure 11B:
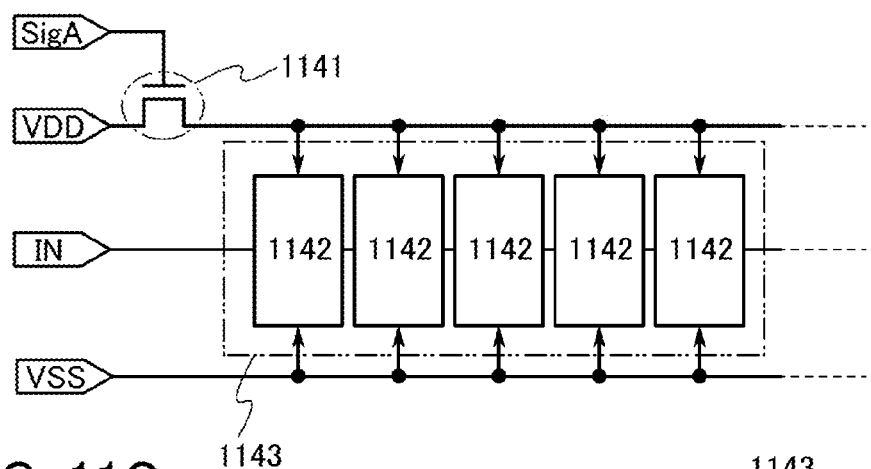
Figure 11C:
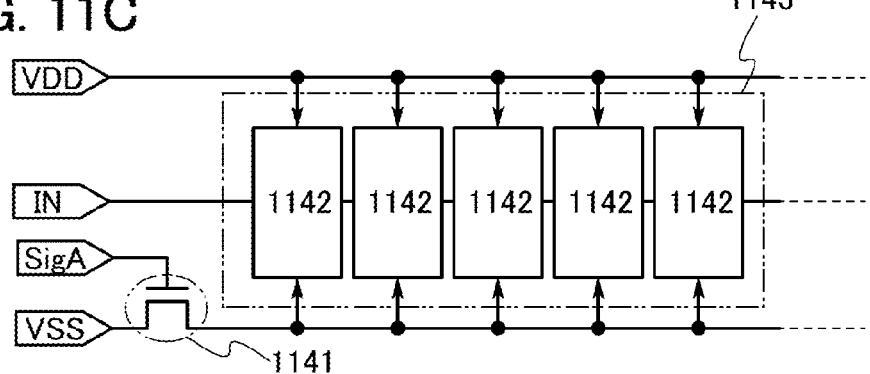

The power supply can be stopped by providing a switching element between a memory cell group and a node to which a power supply potential VDD or a power supply potential VSS is supplied, as illustrated in FIG. 11B or FIG. 11C. Circuits illustrated in FIGS. 11B and 11C are described below.

FIGS. 11B and 11C each illustrate an example of a structure of a memory circuit in which the transistor disclosed in Embodiment 1 is used as a switching element for controlling supply of a power supply potential to a memory cell.

A memory device illustrated in FIG. 11B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and the low-level power supply potential VSS.

In FIG. 11B, the transistor described in Embodiment 1 is used as the switching element 1141, and the switching of the transistor is controlled by a signal SigA supplied to a gate electrode layer thereof.

Note that FIG. 11B illustrates the configuration in which the switching element 1141 includes only one transistor; however, one embodiment of the present invention is not limited thereto, and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 11B, the switching element 1141 may control the supply of the low-level power supply potential VSS.

In FIG. 11C, an example of a memory device in which each of the memory cells 1142 included in the memory cell group 1143 is supplied with the low-level power supply potential VSS through the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined as appropriate with any of the other structures, methods, and the like described in the other embodiments.

Further, Table 1 shows a comparison between a spin-MRAM (spin-transfer torque MRAM) which is known as a spintronics device and a memory using an oxide semiconductor.

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the power for overhead shown in Table 1 is, for example, power for writing data into a memory portion or the like in a processor, which is what is called power consumed for overhead.

As described above, the use of the memory including an oxide semiconductor, which has more advantages than the spintronics device makes it possible to reduce power consumption of a CPU.

The structures, methods, and the like described in this embodiment can be combined as appropriate with any of the other structures, methods, and the like described in the other embodiments.

Embodiment 5

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras

TABLE 1

| | Spintronics (magnetic) | Oxide semiconductor/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/off of FET |
| 4) Si LSI | Suitable for bipolar LSI (MOS transistor is preferred in high integration circuit (Bipolar transistor is unsuitable for High Integration); W is large) | Suitable for MOS LSI |
| 5) Power for Overhead | High Joule heat is needed | Charge and discharge of parasitic capacitance Smaller by 2 or 3 or more orders of magnitude |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | 15 $F^2$ | Depending on the degree of 3D conversion |
| 10) Material | Rare earth magnetic material | Oxide semiconductor material |
| 11) Resistance to magnetic field | Low | High | such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, medical equipment such as dialyzers, and the like. Further, the examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the category of the electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are illustrated in FIGS. 12A to 12C.

Figure 12A:
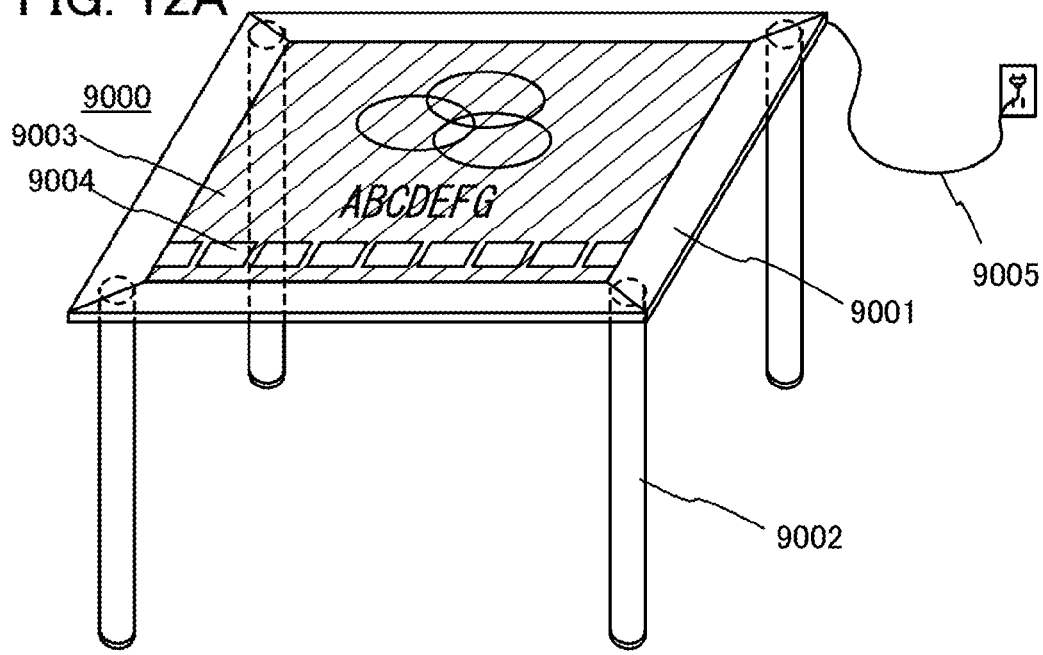
FIGS. 12A to 12C illustrate electronic appliances.
Figure 12B:
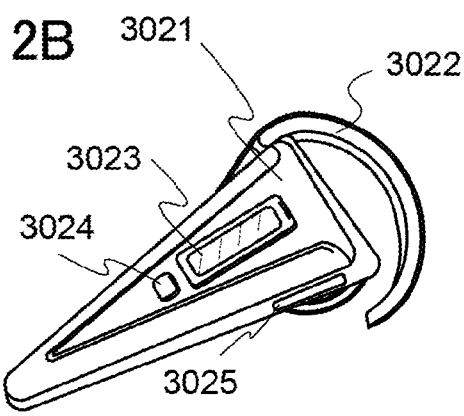
Figure 12C:
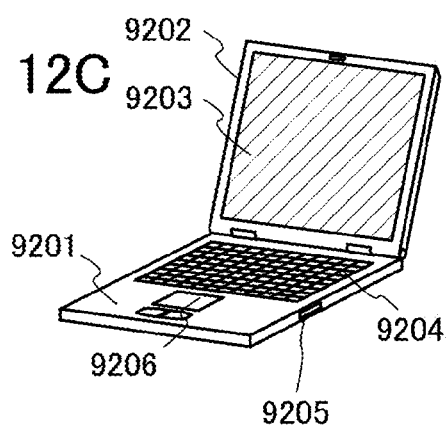

FIG. 12A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of a screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 12B illustrates a portable music player, which includes, in a main body 3021, a display portion 3023, a fixing portion 3022 with which the main body is worn on the ear, a speaker, an operation button 3024, an external memory slot 3025, and the like. The transistor or the memory described in any of Embodiments 1 to 4 is used in a memory or a CPU incorporated in the main body 3021, whereby a portable music player in which power consumption can be further reduced can be provided.

Further, when the portable music player illustrated in FIG. 12B has an antenna, a microphone function, or a wireless communication function and is used with a mobile phone, a user can talk on the phone wirelessly in a hands-free way while driving a car or the like.

FIG. 12C illustrates a computer which includes a main body 9201 including a CPU, a housing 9202, a display portion 9203, a keyboard 9204, an external connection port 9205, a pointing device 9206, and the like. The computer includes a semiconductor device manufactured with the use of one embodiment of the present invention for the display portion 9203. With the use of the CPU described in Embodiment 4, power consumption of the computer can be reduced.

Figure 13A:
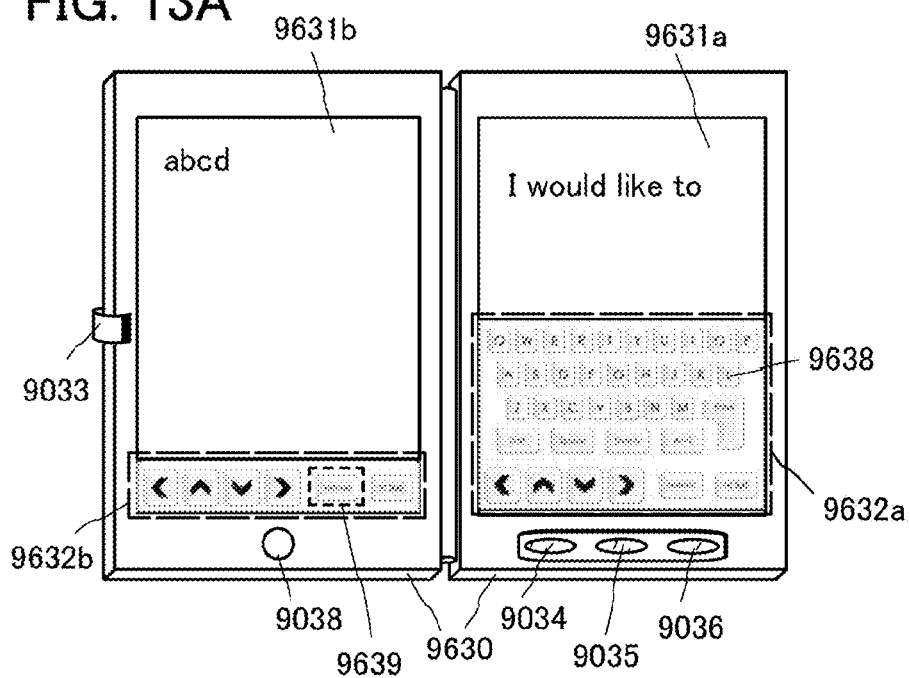
FIGS. 13A to 13C illustrate an electronic appliance.
Figure 13B:
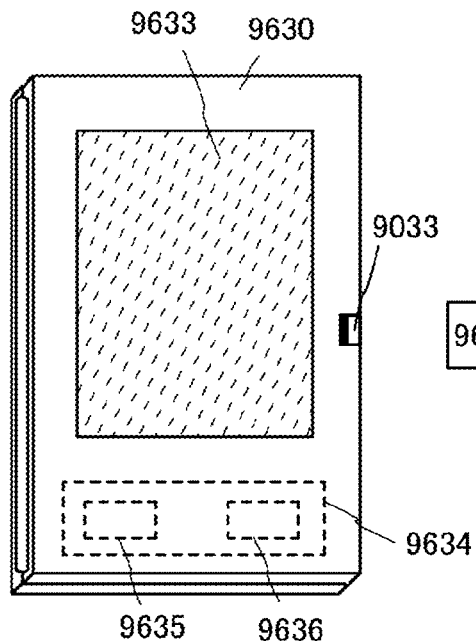

FIGS. 13A and 13B illustrate a tablet terminal that can be folded. In FIG. 13A, the tablet terminal is opened, and includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 13A and 13B, an SRAM or a DRAM is used as a memory for temporarily storing image data. For example, the semiconductor device described in Embodiment 3 can be used as the memory. The semiconductor device described in the above embodiment employed for the memory element enables writing and reading of data to be performed at high speed, enables data to be stored for a long time, and enables power consumption to be sufficiently reduced.

A touch panel area 9632a can be provided in a part of the display portion 9631a, in which data can be input by touching displayed operation keys 9638. Note that FIG. 13A illustrates, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized depending on the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Note that FIG. 13A illustrates an example in which the display portion 9631a and the display portion 9631b have the same display area; however, without limitation thereon, one of the display portions may be different from the other display portion in size and display quality. For example, one of them may be a display panel that can display higher-definition images than the other.

The tablet terminal is closed in FIG. 13B. The tablet terminal includes the housing 9630, a solar cell 9633, a charge/discharge control circuit 9634, a battery 9635, and a DCDC converter 9636. Note that in FIG. 13B, a structure including a battery 9635 and a DCDC converter 9636 is illustrated as an example of the charge/discharge control circuit 9634.

Since the tablet can be folded in two, the housing 9630 can be closed when the tablet is not in use. Thus, the display portions 9631a and 9631b can be protected, thereby providing a tablet with high endurance and high reliability for long-term use.

In addition, the tablet terminal illustrated in FIGS. 13A and 13B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is provided on the surface of the tablet terminal, supplies power to a touch panel, a display portion, an image signal processor, and the like. Note that the solar cell 9633 can be provided on one or both surfaces of the housing 9630 and the battery 9635 can be charged efficiently. When a lithium ion battery is used as the battery 9635, there is an advantage of downsizing or the like.

Figure 13C:
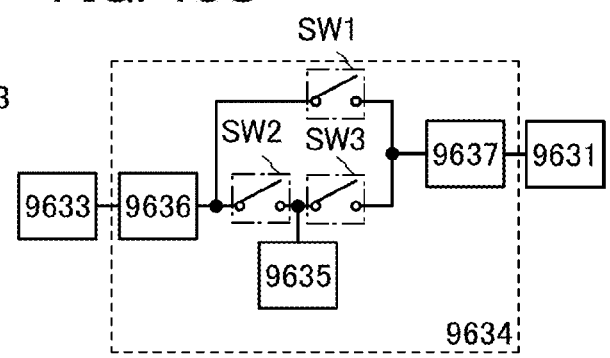

The structure and the operation of the charge/discharge control circuit 9634 illustrated in FIG. 13B are described with reference to a block diagram in FIG. 13C. The solar cell 9633, the battery 9635, the DCDC converter 9636, a converter 9637, switches SW1 to SW3, and the display portion 9631 are illustrated in FIG. 13C, and the battery 9635, the DCDC converter 9636, the converter 9637, and the switches SW1 to SW3 correspond to the charge/discharge control circuit 9634 in FIG. 13B.

First, an example of operation in the case of generating power by the solar cell 9633 using external light is described. The voltage of power generated by the solar cell 9633 is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 may be turned off and a switch SW2 may be turned on so that the battery 9635 is charged.

Here, the solar cell 9633 is given as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 14A:
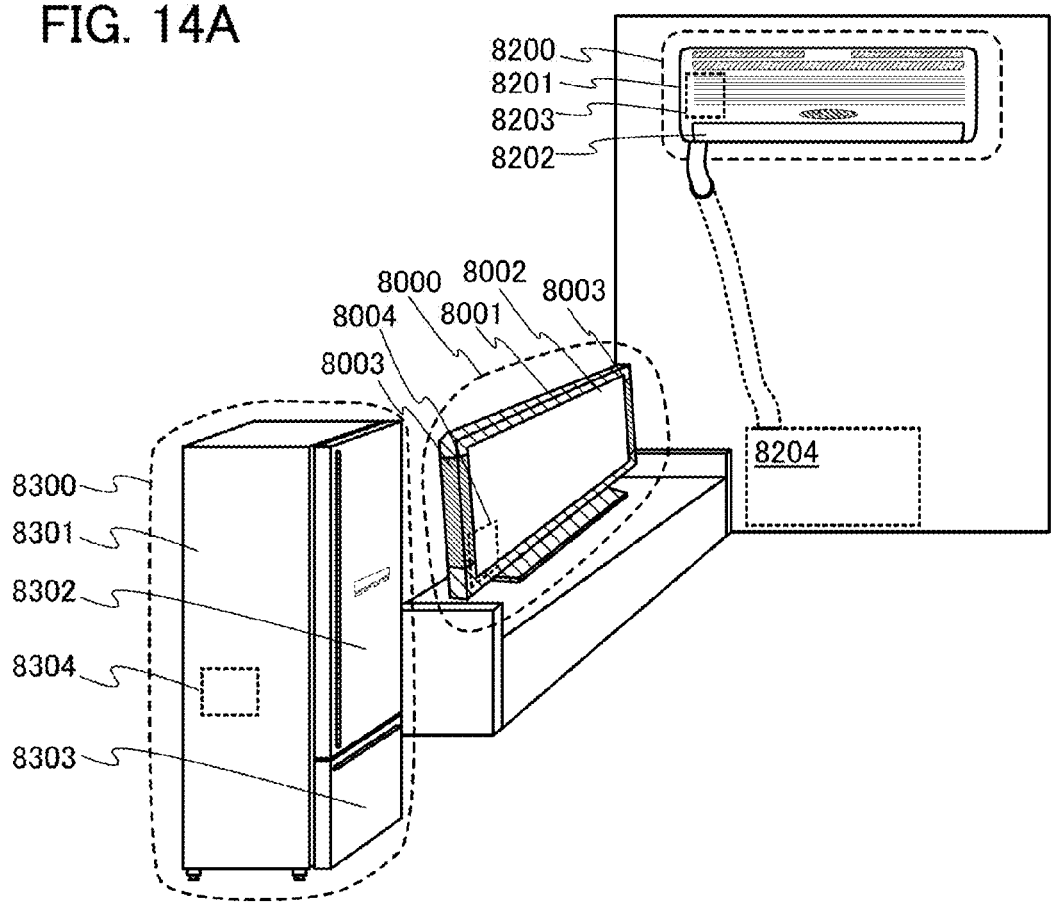
FIGS. 14A to 14C illustrate electronic appliances.

In a television set 8000 in FIG. 14A, a display portion 8002 is incorporated in a housing 8001. The display portion 8002 displays an image and a speaker portion 8003 can output sound. The transistor described in Embodiment 1 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. With the receiver, general television broadcasting can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory or the CPU described in Embodiment 3 or 4 can be used for the television set 8000.

In FIG. 14A, an air conditioner which includes an indoor unit 8200 and an outdoor unit 8204 is an example of an electrical appliance in which the CPU of Embodiment 4 is used. Specifically, the indoor unit 8200 includes a housing 8201, an air outlet 8202, a CPU 8203, and the like. Although the CPU 8203 is provided in the indoor unit 8200 in FIG. 14A, the CPU 8203 may be provided in the outdoor unit 8204. Alternatively, the CPU 8203 may be provided in both the indoor unit 8200 and the outdoor unit 8204. Since the CPU described in Embodiment 4 is a CPU in which an oxide semiconductor is used, an air conditioner having excellent heat resistance property and high reliability can be provided with the use of the CPU.

In FIG. 14A, an electric refrigerator-freezer 8300 is an example of an electrical appliance which is provided with the CPU using an oxide semiconductor. Specifically, the electric refrigerator-freezer 8300 includes a housing 8301, a door for a refrigerator 8302, a door for a freezer 8303, a CPU 8304, and the like. In FIG. 14A, the CPU 8304 is provided in the housing 8301. When the CPU described in Embodiment 4 is used as the CPU 8304 of the electric refrigerator-freezer 8300, power saving can be achieved.

Figure 14B:
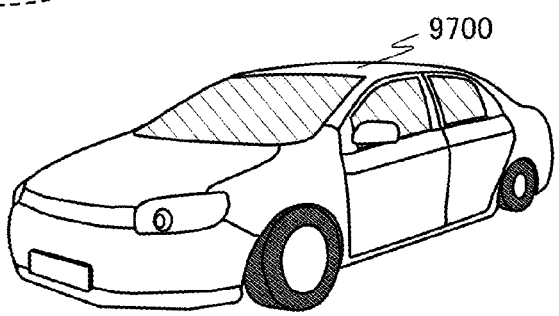
Figure 14C:
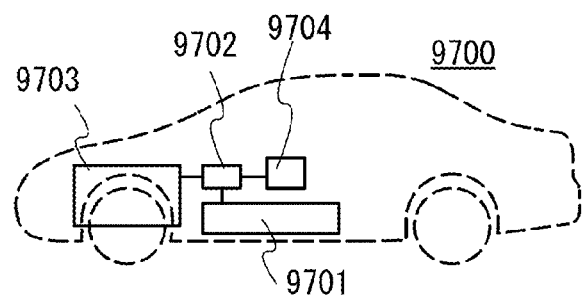

FIGS. 14B and 14C illustrate an example of an electric vehicle which is an example of an electrical appliance. An electric vehicle 9700 is equipped with a secondary battery 9701. The output of power of the non-aqueous secondary battery 9701 is adjusted by a control circuit 9702 and the power is supplied to a driving device 9703. The control circuit 9702 is controlled by a processing unit 9704 including a ROM, a RAM, a CPU, or the like which is not illustrated. When the CPU described in Embodiment 4 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, methods, and the like described in this embodiment can be combined as appropriate with any of the other structures, methods, and the like described in the other embodiments.

This application is based on Japanese Patent Application serial no. 2012-091204 filed with Japan Patent Office on Apr. 12, 2012, the entire contents of which are hereby incorporated by reference.

What is claimed is:

1. A semiconductor device comprising:
a first insulating film containing aluminum oxide;
a conductive layer over the first insulating film;

a first oxide insulating film over the conductive layer, wherein the first oxide insulating film, and wherein an upper surface of the first oxide insulating film is planarized;
an oxide semiconductor layer comprising a channel formation region over the planarized surface of the first oxide insulating film, wherein the channel formation region overlaps with the conductive layer;
a source electrode layer and a drain electrode layer electrically connected to the oxide semiconductor layer;
a gate insulating film over the oxide semiconductor layer;
a gate electrode layer over the channel formation region with the gate insulating film interposed therebetween; and
a second insulating film containing aluminum oxide over the oxide semiconductor layer, the source electrode layer, the drain electrode layer, and the gate electrode layer,
wherein the first oxide insulating film comprises a first region which overlaps with the conductive layer, and a second region which does not overlap with the conductive layer,
wherein a first thickness of the first oxide insulating film in the first region is smaller than a second thickness of the first oxide insulating film in the second region,
wherein the first insulating film is in direct contact with the second insulating film, and
wherein the conductive layer, the first oxide insulating film, the oxide semiconductor layer, the source electrode layer, the drain electrode layer, the gate insulating film, and the gate electrode layer are between the first insulating film and the second insulating film.

2. The semiconductor device according to claim 1, wherein the gate insulating film is a second oxide insulating film.

3. The semiconductor device according to claim 1, further comprising a third insulating film containing aluminum oxide between the conductive layer and the first oxide insulating film.

4. The semiconductor device according to claim 1,
wherein the conductive layer comprises a first conductive film and a second conductive film over the first conductive film, and
wherein the second conductive film comprises a metal oxide containing nitrogen.

5. The semiconductor device according to claim 1,
wherein the gate electrode layer comprises a first conductive film and a second conductive film over the first conductive film, and
wherein the first conductive film comprises a metal oxide containing nitrogen.

6. The semiconductor device according to claim 1, wherein the gate electrode layer overlaps with the source electrode layer and the drain electrode layer.

7. The semiconductor device according to claim 1, wherein the oxide semiconductor layer comprises a first oxide semiconductor film and a second oxide semiconductor film over the first oxide semiconductor film.

8. A semiconductor device comprising:
a first insulating film containing aluminum oxide;
a conductive layer over the first insulating film;
a first oxide insulating film over the conductive layer and the first insulating film, wherein the first oxide insulating film comprises an oxygen excess region, and wherein an upper surface of the first oxide insulating film is planarized;
an oxide semiconductor layer comprising a channel formation region over the planarized surface of the first oxide insulating film, wherein the channel formation region overlaps with the conductive layer;
a source electrode layer and a drain electrode layer electrically connected to the oxide semiconductor layer;
a gate insulating film over the oxide semiconductor layer;
a gate electrode layer over the channel formation region with the gate insulating film interposed therebetween; and
a second insulating film containing aluminum oxide over the oxide semiconductor layer, the source electrode layer, the drain electrode layer, and the gate electrode layer,
wherein the first oxide insulating film comprises a first region which overlaps with the conductive layer, and a second region which does not overlap with the conductive layer,
wherein a first thickness of the first oxide insulating film in the first region is smaller than a second thickness of the first oxide insulating film in the second region,
wherein a first distance between the oxygen excess region in the first region and the channel formation region is shorter than a second distance between the oxygen excess region in the second region and each of the source electrode layer and the drain electrode layer,
wherein the first insulating film is in direct contact with the second insulating film, and
wherein the conductive layer, the first oxide insulating film, the oxide semiconductor layer, the source electrode layer, the drain electrode layer, the gate insulating film, and the gate electrode layer are between the first insulating film and the second insulating film.

9. The semiconductor device according to claim 8, wherein the gate insulating film is a second oxide insulating film.

10. The semiconductor device according to claim 8, further comprising a third insulating film containing aluminum oxide between the conductive layer and the first oxide insulating film.

11. The semiconductor device according to claim 8,
wherein the conductive layer comprises a first conductive film and a second conductive film over the first conductive film, and
wherein the second conductive film comprises a metal oxide containing nitrogen.

12. The semiconductor device according to claim 8,
wherein the gate electrode layer comprises a first conductive film and a second conductive film over the first conductive film, and
wherein the first conductive film comprises a metal oxide containing nitrogen.

13. The semiconductor device according to claim 8, wherein the gate electrode layer overlaps with the source electrode layer and the drain electrode layer.

14. The semiconductor device according to claim 8, wherein the oxide semiconductor layer comprises a first oxide semiconductor film and a second oxide semiconductor film over the first oxide semiconductor film.

* * * * *